United States Patent
Katata et al.

(10) Patent No.: US 7,529,400 B2
(45) Date of Patent: May 5, 2009

(54) IMAGE ENCODER, IMAGE DECODER, RECORD MEDIUM, AND IMAGE RECORDER

(75) Inventors: Hiroyuki Katata, Chiba (JP); Tadashi Uchiumi, Urayasu (JP); Takashi Yasumoto, Higashihiroshima (JP); Shinya Hasegawa, Chiba (JP); Shingo Nagataki, Chiba (JP); Masatoshi Tsujimoto, Chiba (JP); Motohiro Itoh, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 369 days.

(21) Appl. No.: 10/511,762

(22) PCT Filed: Apr. 25, 2003

(86) PCT No.: PCT/JP03/05380

§ 371 (c)(1),
(2), (4) Date: Oct. 19, 2004

(87) PCT Pub. No.: WO03/092305

PCT Pub. Date: Nov. 6, 2003

(65) Prior Publication Data

US 2005/0147309 A1    Jul. 7, 2005

(30) Foreign Application Priority Data

| Apr. 25, 2002 | (JP) | 2002-124126 |
| Sep. 25, 2002 | (JP) | 2002-279673 |
| Nov. 15, 2002 | (JP) | 2002-332455 |

(51) Int. Cl.
  *G06K 9/00* (2006.01)
  *G06T 15/00* (2006.01)
  *G06T 15/10* (2006.01)

(52) U.S. Cl. .................. 382/154; 345/419; 345/427

(58) Field of Classification Search ............. 382/285, 382/284, 154; 345/629–641, 419–427; 348/584–601
See application file for complete search history.

(56) References Cited

U.S. PATENT DOCUMENTS

| 6,377,625 | B1 | 4/2002 | Kim et al. | |
| 6,784,917 | B1* | 8/2004 | Yamamoto et al. | 348/43 |
| 7,064,754 | B2* | 6/2006 | Iizuka et al. | 345/419 |
| 2002/0054207 | A1* | 5/2002 | Iizuka et al. | 348/54 |
| 2002/0122585 | A1* | 9/2002 | Swift et al. | 382/154 |

FOREIGN PATENT DOCUMENTS

| EP | 0 944 258 A1 | 9/1999 |
| JP | 11-41627 | 2/1999 |
| JP | 11-113026 A | 4/1999 |
| JP | 11-191895 A | 7/1999 |
| JP | 2002-10299 A | 1/2002 |
| KR | 2000-17775 A | 4/2000 |

\* cited by examiner

*Primary Examiner*—Matthew C Bella
*Assistant Examiner*—Randolph Chu
(74) *Attorney, Agent, or Firm*—Birch, Stewart, Kolasch & Birch, LLP

(57) ABSTRACT

A sub-sampling portion (101) sub-samples images of data corresponding to the left and right viewpoints. A joining method selector (104) selects the joining method that minimizes the discontinuity at the boundary in the joined image when the sub-sampled images of data are joined. A joining portion (102) joins the plurality of images data, based on the selected joining method. An encoder (103) encodes the joined image data, and a joining method encoder (105) encodes the information of the joining method. A multiplexer (106) multiplexes these pieces of coded data. In this way, the continuity of the joined image is improved, whereby the coding efficiency is enhanced.

16 Claims, 21 Drawing Sheets

(a)

(b)

(c)

(d) (e) (f)

Stereo control information{
Stereo control information identifier
Stereo control information length
Joining direction
 Image inversion ID information
Shift quantity
2D display image generating method
}

← Tape travel direction

IMAGE ENCODER, IMAGE DECODER, RECORD MEDIUM, AND IMAGE RECORDER

TECHNICAL FIELD

The present invention relates to an image coding apparatus, image decoding apparatus, recording medium and image recording apparatus for coding and decoding image data composed of multiple images observed from different viewpoints.

BACKGROUND ART

Conventionally, as a method of coding a stereo image by joining two still images taken from different viewpoints, a technology has been disclosed in Japanese Patent Application Laid-open Hei 11 No. 41627.

FIG. 15 is a block diagram showing a coding apparatus for stereo images in this prior art technology. A sub-sampling portion 1501 is a portion that sub-samples still image data; a joining portion 1502 is a portion that joins the thinned out still image data; and an encoder 1503 is a portion that encodes the joined still image data.

The operation of each portion will be described next.

Sub-sampling portion 1501 sub-samples input still image data to half in the horizontal direction. Here, the still image data is assumed to be input as, first, the image data (left image) for the left eye and then the image data (right image) for the right eye. In advance of the sub-sampling process, in sub-sampling portion 1501 each image is passed through a low-pass filter with respect to the horizontal direction so as to remove fold-over noise resulting from sub-sampling. Joining portion 1502 joins the left image and right image, both sub-sampled in the horizontal direction, into a joined image. In this case, the left image is put on the left side of the joined image and the right image is put on the right side of the joined image.

FIG. 16 is an illustrative view showing how the input images are sub-sampled by sub-sampling portion 1501 and joined in joining portion 1502. The figures in FIG. 16 represent the horizontal coordinate values of the pixels of the image before sub-sampling. Because both the left image and the right image are sub-sampled to half with respect to the horizontal direction, the number of pixels in the horizontal direction of the joined image is equal to the number of pixels in the horizontal direction of the input left or right image. Here, it is assumed that the number of horizontal pixels before sub-sampling is even-numbered.

Encoder 1503 encodes the joined image. For the coding of still images, international standard schemes such JPEG and the like may be used. The coded joined image of data (encoded data) is stored into an unillustrated recording medium. In this way, the left and right images for a stereo image are joined into a single joined image, which in turn is coded.

FIG. 17 is an example of a joined image created by a prior art. The pixel values across the boundary between the joined left and right images are generally discontinuous. Therefore, there is a problem in that the coding efficiency lowers when JPEG or other coding is carried out. For example, if the boundary between the left and right images exists in a DCT block of JPEG, the high-frequency components of DCT coefficients become large, hence the coding efficiency lowers.

Further, when the prior art is applied to a movie, an international standard scheme such as MPEG-4 or the like is used for encoding the joined image. If a boundary between the left and right images resides in a DCT block, the coding efficiency lowers.

Moreover, in the case of MPEG-4, even if no boundaries reside within a DCT block, there may occur a case where the coding efficiency lowers. Illustratively, in MPEG-4, the DCT coefficients of a block to be coded are predictively coded based on the surrounding blocks within the same frame to thereby improve the coding efficiency. Since the DCT coefficient of the left image is generally discontinuous from that of the right image around the boundary, prediction of DCT coefficients yields poor results, hence the coding efficiency lowers.

On the other hand, when a joined image for stereo display is output on a 2-dimensional display device, there is no definite method for generating a joined image into a 2D display image. Therefore, an identical output result cannot be obtained between image reproduction devices.

It is an object of the present invention to provide solution to these problems and to provide an image coding apparatus, image decoding apparatus, recording medium and image recording apparatus which enable efficient coding and decoding when stereo images are coded and decoded after joining.

DISCLOSURE OF INVENTION

According to the present invention, an image coding apparatus for coding a plurality of images data corresponding respectively to a plurality of viewpoints, includes: a joining method selecting means for selecting a joining method when the plurality of images data are joined; a joining means for joining the plurality of images data based on the joining method selected by the joining method selecting means; a coding means for coding a joined image data; and a joining method coding means for coding information of the selected joining method.

The image coding apparatus according to the present invention is characterized by inclusion of a sub-sampling means for sub-sampling the plurality of images data to output a resultant to the joining means. Here, it is preferred that a plurality of the sub-sampling means are provided respectively for the plurality of viewpoints.

The image coding apparatus according to the present invention is characterized by inclusion of a control means that determines a frame for which the joining method is selected and controls the joining method selecting means so as to select the joining method for the determined frame only. Here, it is preferred that the control means controls the joining method coding means so as to code the information of the joining method for the determined frame only.

Further, the image coding apparatus according to the present invention is characterized by inclusion of a shift quantity calculating means for calculating a shift quantity by which part of images is shifted relative to the other images when the plurality of images data are joined based on the information of the joining method selected by the joining method selecting means and by that the joining method coding means encodes data of the shift quantity together with the information of the joining method.

According to the present invention, an image decoding apparatus for decoding coded data of joined image data and joining method information, the joined image data being formed by joining a plurality of images data corresponding respectively to a plurality of viewpoints, in a predetermined joining method, includes: a decoding means for decoding the joined image data; a joining method decoding means for decoding the joining method information; and a display data generating means for generating display data using a decoded image data and a decoded joining method information.

The image decoding apparatus according to the present invention is characterized in that the decoding means determines a specific frame to be decoded and the joining method decoding means decodes the joining method of the determined frame.

The image decoding apparatus according to the present invention is characterized in that the joining method decoding means decodes a shift quantity by which part of images is shifted relative to the other images and the display data generating means generates the display data using the shift quantity.

According to the present invention, an image coding apparatus for coding a plurality of images data corresponding respectively to a plurality of viewpoints, includes: a joining means for joining the plurality of images data based on a predetermined joining method; a coding means for coding a joined image data; and a 2-dimensional display image generating method coding means for coding a method of generating a 2-dimensional display image from the joined image data.

The image coding apparatus according to the present invention is characterized by inclusion of a 2-dimensional display image generating method coding means for coding a method of generating a 2-dimensional display image from the joined image data. In this case, the apparatus is also characterized by inclusion of a 2-dimensional display image generating method selecting means for selecting the method of generating the 2-dimensional display image from the joined image data, disposed on an upstream of the 2-dimensional display image generating method coding means.

According to the present invention, an image decoding apparatus for decoding coded data of joined image data and 2-dimensional display image generating method information, the joined image data being formed by joining a plurality of images data corresponding respectively to a plurality of viewpoints, in a predetermined joining method, includes: a decoding means for decoding the joined image data; a 2-dimensional display image generating method decoding means for decoding the 2-dimensional display image generating method information; and a 2-dimensional display image generating means for generating a 2-dimensional display image, using a decoded image data and a decoded 2-dimensional display image generating method information. Further, in the image decoding apparatus having a display generating means, the apparatus is characterized by inclusion of a 2-dimensional display image generating method decoding means for decoding 2-dimensional display image generating method information; and a 2-dimensional display image generating means for generating a 2-dimensional display image, using the decoded image data, the decoded joining method information and a decoded 2-dimensional display image generating method information, instead of the display data generating means.

The present invention is characterized in that the 2-dimensional display image is a miniaturized image for displaying a plurality of the joined images data in a menu representation.

According to the present invention, a recording medium for storing a plurality of coded images data corresponding respectively to a plurality of viewpoints, together with header information, in a predetermined format, is characterized in that the header portion stores stereo image identification information that represents the fact that the coded data constitutes a stereo image made up of a plurality of images data and information that represents a joining method of joining the plurality of images data.

In the above recording medium, the invention is characterized in that, when the coded data represents a stereo image, the header portion further stores information indicating a method of generating a 2-dimensional display image from the coded data.

In the above recording medium, the invention is characterized in that the header portion is repeatedly multiplexed to the coded data.

The invention is characterized by inclusion of a display means capable of switching between a stereo representation and a 2-dimensional representation.

The invention is characterized in that automatic switching is done between the stereo representation and the 2-dimensional representation, based on the information stored in the header portion.

According to the present invention, an image recording apparatus for recording a plurality of images data corresponding respectively to a plurality of viewpoints, into a predetermined recording area, includes: a joining means for joining the plurality of images data using a predetermined joining method; and a joining method coding means for coding information of the joining method, and is characterized in that the recording area includes: an image recording sector for recording a joined image data or a 2-dimensional image data; an audio recording sector for recording an audio data; and a subcode area for recording an associated information.

According to the present invention, an image recording apparatus for recording a plurality of images data corresponding respectively to a plurality of viewpoints, into a predetermined recording area, includes: a joining means for joining the plurality of images data using a predetermined joining method; and a joining method coding means for coding information of the joining method, and is characterized in that the recording area includes an image recording sector for recording a joined image data or a 2-dimensional image data, and the coded data of the information of the joining method is recorded in the image recording sector.

According to the present invention, an image recording apparatus for recording a plurality of images data corresponding respectively to a plurality of viewpoints, into a predetermined recording area, includes: a joining means for joining the plurality of images data using a predetermined joining method; and a joining method coding means for coding information of the joining method, and is characterized in that the recording area includes an audio recording sector for recording an audio data, and a coded data of the information of the joining method is recorded in the audio recording sector.

According to the present invention, an image recording apparatus for recording a plurality of images data corresponding respectively to a plurality of viewpoints, into a predetermined recording area, includes: a joining means for joining the plurality of images data using a predetermined joining method; and a joining method coding means for coding information of the joining method, and is characterized in that the recording area includes a subcode sector for recording an associated information, and a coded data of the information of the joining method is recorded in the subcode recording sector.

According to the present invention, an image recording apparatus for recording a plurality of images data corresponding respectively to a plurality of viewpoints, into a recording area, includes: a joining means for joining the plurality of images data using a predetermined joining method; and a 2-dimensional display image generating method coding means for encoding a method of generating a 2-dimensional display image from a joined image data, and is characterized in that the recording area includes: an image recording sector for recording the joined image data or the 2-dimensional image data; an audio recording sector for recording an audio data; and a subcode sector for recording an associated information.

According to the present invention, an image recording apparatus for recording a plurality of images data corresponding to multiple viewpoints, into a recording area, includes: a joining means for joining the multiple images of data using a predetermined joining method; and a 2-dimensional display image generating method coding means for encoding a method of generating a 2-dimensional display image from a joined image data, and is characterized in that the recording area includes an image recording sector for recording the joined image data or a 2-dimensional image data, and a coded data of information of generating the 2-dimensional display image is recorded in the image recording sector.

According to the present invention, an image recording apparatus for recording a plurality of images data corresponding respectively to a plurality of viewpoints, into a recording area, includes: a joining means for joining the plurality of images data using a predetermined joining method; and a 2-dimensional display image generating method coding means for encoding a method of generating a 2-dimensional display image from a joined image data, and is characterized in that the recording area includes an audio recording sector for recording an audio data, and a coded data of information of generating the 2-dimensional display image is recorded in the audio recording sector.

According to the present invention, an image recording apparatus for recording a plurality of images data corresponding respectively to a plurality of viewpoints, into a recording area, includes: a joining means for joining the plurality of images data using a predetermined joining method; and a 2-dimensional display image generating method coding means for encoding a method of generating a 2-dimensional display image from a joined image data, and is characterized in that the recording area includes a subcode sector for recording an associated information, and a coded data of information of generating the 2-dimensional display image is recorded in the subcode recording sector.

According to the image coding apparatus of the present invention, since, for encoding of a stereo image after joining, the joining and encoding of images is performed so as to enhance the continuity of the joined image at the boundary, it is possible to achieve efficient coding. Further, images to be joined are input in parallel and subjected to joining and coding processes, whereby it is possible to reduce the delay of the coding process.

According to the image coding apparatus of the present invention, the selecting process of the joining method is linked with the coding process. Therefore, it is possible to improve the processing efficiency in a case where choice of the joining method is made only when it is required. Further, when selection of the joining method is effected for intra-frame coded frames only, the same joining method as the previous frame is used for an inter-frame coded frame. Therefore, an efficient coding can be achieved.

According to the image coding apparatus of the present invention, shifting of the images at joining so as to reduce the influence from parallax makes it possible to achieve a further improvement of the coding efficiency.

According to the image decoding apparatus of the present invention, when a stereo image is encoded after joining, it is possible to decode the data which has been efficiently encoded by joining the images so that the continuity of the joined image at the boundary will be enhanced.

According to the image decoding apparatus of the present invention, it is possible to decode the coded data which was efficiently coded by a coding process that is linked with the selecting process of the joining method whereby choice of the joining method is made only when it is required. When selection of the joining method is effected for intra-frame coded frames only, it is possible to decode the coded data that was efficiently coded by the above way, by indicating that current decoding frame is an intra-frame coded frame, to the joining method decoder.

According to the image decoding apparatus of the present invention, it is possible to decode the coded data which was coded by shifting the images at joining so as to lessen the influence from parallax, and restore the original image by shifting the images that have been shifted at joining, in reverse.

According to the image coding apparatus of the present invention, the method of generating a 2-dimensional display image from the joined image for stereo display is coded together with the joined image, whereby it is possible to output a definite 2-dimensional display image that is common between different image decoding apparatuses.

According to the image decoding apparatus of the present invention, when the method of generating a 2-dimensional display image was encoded together, it is possible to obtain a 2-dimensional display image that is not dependent on the image decoding apparatus, from the decoded result of the joined image and the 2-dimensional display image generating method.

According to the recording medium of the present invention, the stereo-image identification information that indicates the entity of a stereo image and the joining method thereof, the control information that indicates the 2-dimensional display image generating method and the like are also encoded and recorded or transmitted, together with the joined image of the stereo image, whereby it is possible to perform image display suited to the decoding apparatus side.

According to the image decoding apparatus of the present invention, it is possible to automatically switch the display between stereo representation and 2D representation, in accordance with the content of the coded data.

According to the image recording apparatus of the present invention, since pieces of data are recorded respectively into the image sector, audio sector and subcode sector, it is possible to effect both synchronous recording and post-recording.

According to the image recording apparatus of the present invention, since the joining method information and the information of generating a 2-dimensional display image are recorded in the image sector and the audio sector, there is no fear of the these pieces of information being changed accidentally even when the subcode sector is rewritten by post-recording. Alternatively, when all pieces of coded information data are stored into one storage area, all pieces of the associated information relating to the image are gathered in one place, bringing an advantage of easy handling though easiness of post-recording cannot be obtained. This may also make it no longer necessary to handle the subcode sector.

According to the image recording apparatus of the present invention, since the joining method information and the information of generating a 2-dimensional display image are recorded into the subcode sector in the recording area, the subcode recording sector can be recorded by post-recording, hence can be modified easily.

BEST MODE FOR CARRYING OUT THE INVENTION

The embodiments of the present invention will be hereinbelow described with reference to the drawings.

The First Embodiment

Figure 1:
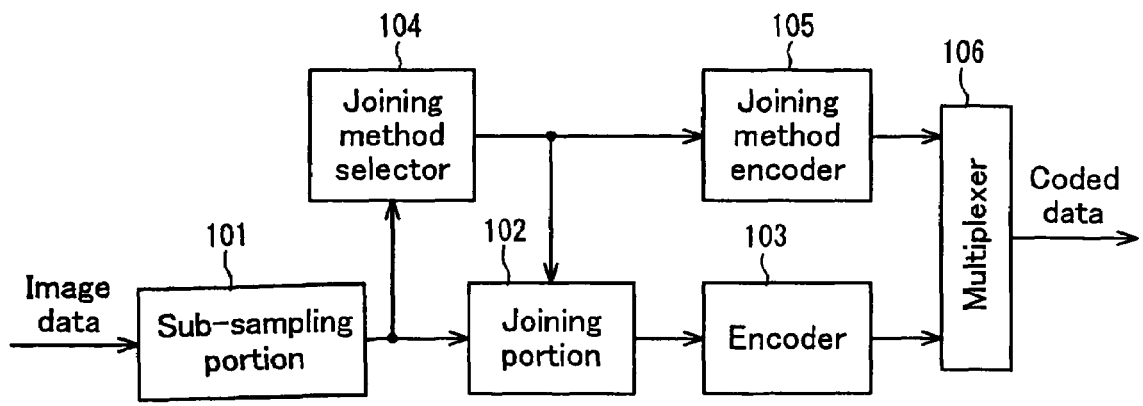
FIG. 1 is a block diagram showing an image coding apparatus of the first embodiment of the present invention.

FIG. 1 is a block diagram showing an image coding apparatus of the first embodiment of the present invention. A sub-sampling portion 101 is a portion that sub-samples images of data; a joining portion 102 is a portion that joins the sub-sampled images of data; an encoder 103 is a portion that encodes the joined image data; a joining method selector 104 is a portion that selects an image data joining method from a plurality of joining methods; a joining method encoder 105 is a portion that encodes the information of the selected joining method; and a multiplexer 106 is a portion that multiplexes the encoded image data and the encoded information of the joining method to generate coded data.

Now, the image coding apparatus of the first embodiment will be described in detail with reference to the drawings.

Sub-sampling portion 101 sub-samples the input image data to half with respect to the horizontal direction, in the same manner as described in the prior art. Here, the image data is not limited to still image data, but movie data can be included. When movie data is input, the left and right images are input alternately for every frame, such as the image data for the left eye (left image) of frame 1, the image data for the right eye (right image) of frame 1, the left image of frame 2, the right image of frame 2, and the like.

Figure 2:
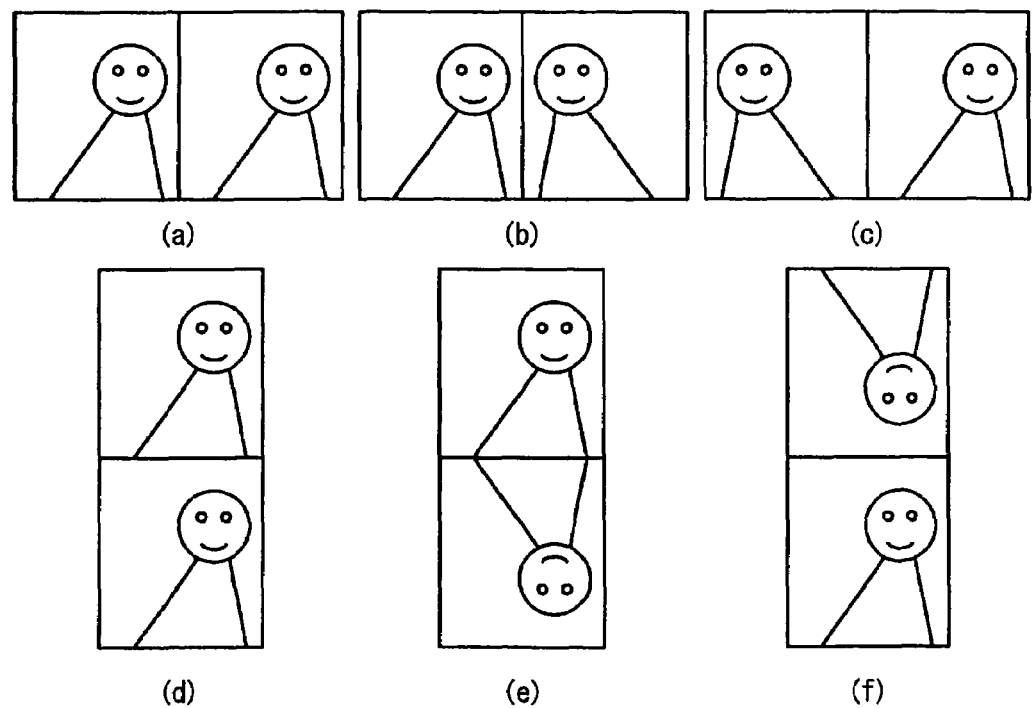
FIG. 2 is an illustrative view showing an example of a joining method of images in the present invention.

Joining method selector 104 selects a joining method of left and right images. FIG. 2 shows selectable examples of joining methods by the joining method selector. FIG. 2(a) is a joined image in which the right image is arranged on the right side of the left image, in the same manner as described in the prior art. FIG. 2(b) is a joined image in which the right image that is inverted with respect to the horizontal direction is arranged on the right side of the left image. Here, if g(x,y) represents the pixel value of the image that is created by inverting an image with pixel values of f(x,y) with respect to the horizontal direction, the two are related as follows:

$$g(x,y)=f(M-1-x, y) \ (x=0, 1, \ldots M-1; y=0, 1, \ldots N-1),$$

where (x,y) represents horizontal and vertical coordinate values, M the number of pixels in the horizontal direction of the image, and N the number of pixels in the vertical direction of the image. The horizontal inversion and vertical inversion in the following description are also performed in the same manner.

FIG. 2(c) is a joined image in which the right image is arranged on the right side of the left image that is inverted with respect to the horizontal direction. FIG. 2(d) is a joined image in which the right image is arranged under the left image. FIG. 2(e) is a joined image in which the right image that is inverted with respect to the vertical direction is arranged under the left image. FIG. 2(f) is a joined image in which the right image is arranged under the left image that is inverted with respect to the vertical direction.

Next, the way the joining method is selected will be described.

Figure 3:
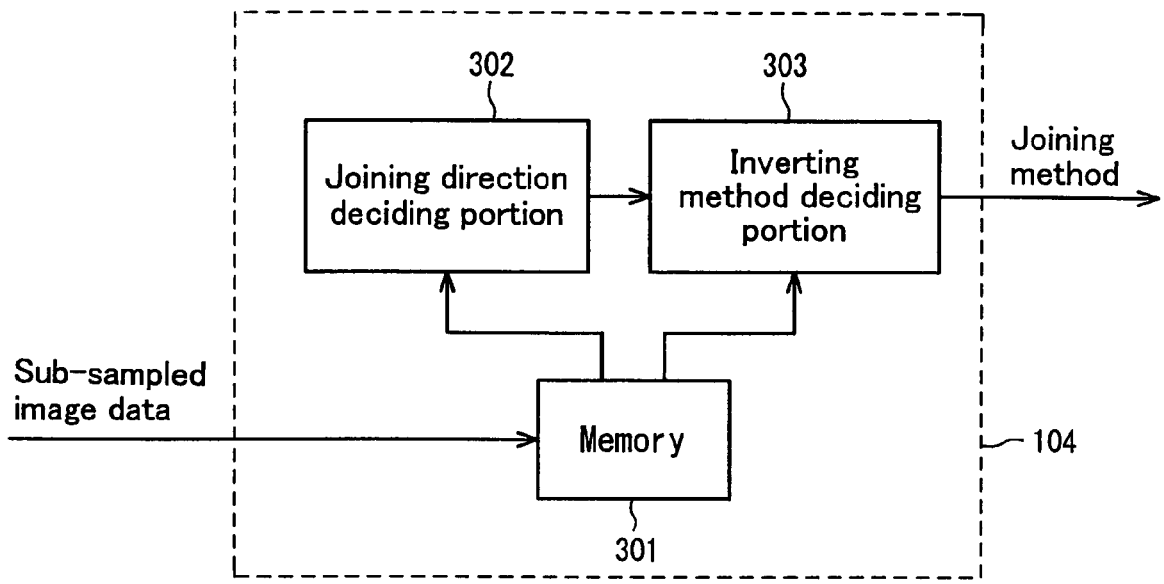
FIG. 3 is a block diagram showing an example of a joining method selector in the present invention.

FIG. 3 is a diagram showing an internal configuration example of a joining method selector 104. A memory 301 is a portion that stores sub-sampled image data; a joining direction deciding portion 302 is a portion that decides the directions and arrangement of the left and right images; and an inverting method deciding portion 303 is a portion that decides the method of inversion of the left or right image.

The operation for selecting the joining method will be described in detail.

Memory 301 stores one frame of the input sub-sampled left image and one frame of the input sub-sampled right image. Joining direction deciding portion 302 decides whether the left and right images are arranged left and right or up and down. For example, the length (the number of pixels) of the boundary between the images when they are arranged left and right and the length (the number of pixels) of the boundary between the images when they are arranged up and down are compared so as to determine the arrangement having a shorter boundary as the joining direction.

Inverting method deciding portion 303 decides the inverting way of the left or right image. For example, when joining direction deciding portion 302 has decided the images to be arranged left and right, the portion 303 determines the inverting method whereby the discontinuity at the boundary of the joined image becomes minimum. The methods for estimating the discontinuity of the boundary include: a way where the absolute values of the differences between pixel values on the left and right of the boundary are summed up along the whole boundary so as to regard the summation as the index of discontinuity; a way where possible change between the pixel values on the left and right of the boundary is checked based on a threshold process so that the total number of pixels with change is regarded as the index of discontinuity; and other methods.

For determination of the discontinuity, there are some methods including: the method wherein only the luminance is used, the method wherein the chrominance is used; the method wherein both the luminance and the chrominance are used; and others. Further, as the pixels on the left and right of the boundary, only the left and right pixels adjoining the boundary may be used, the pixels two or more pixels off the boundary may be included.

In the above description, the direction of joining is determined first, then the direction of inversion is determined. However, the method of joining should not be limited to this. For example, it is possible to select the inverting method presenting the minimum boundary discontinuity for all the six kinds of joining methods shown in FIG. 2. Further, as the methods of joining, various combinations can be considered, so that it is not necessary to use those shown in FIG. 2. For example, instead of FIG. 2(a), the whole part may be turned left side right and the resultant may be used as FIG. 2(a).

In the above way, joining method selector 104 makes choice of a joining method, adaptively.

Joining portion 102 joins the sub-sampled left image and the sub-sampled right image in accordance with the selected joining method. Encoder 103 encodes the joined image created by joining portion 102. As the coding method, international standard schemes such as JPEG, JPEG2000 and the like may be used for still images. For movies, international standard schemes such as MPEG-1, MPEG-2, MPEG-4 and the like may be used. When only intra-frame coding is used for coding movies, Motion JPEG or other schemes may be used. The image coding scheme should not be limited to those mentioned above and non-standard scheme may be used.

Joining method encoder 105 encodes the information of the joining method selected by joining method selector 104. As the coding method, fixed length coding, variable length coding can be used. In the case where there are six kinds of methods (a) to (f) as in FIG. 2, in fixed length coding, each method is coded by allotting 3-bit fixed length codes. In variable length coding, each method is coded by allotting variable length codes such as Huffman codes or the like. For variable length coding, arithmetic coding may be used instead of allotting variable length codes.

It is also possible to encode the information of the joining method by separating the joining direction and the inverting method as described hereinbelow. In the case of six methods shown in FIG. 2, the first information as to whether the joining direction is horizontal or vertical is encoded first, then the second information as to which inverting method is used from the three is encoded. For example, when the first information indicates "horizontal", any one of (a) to (c) should be designated by the second information. The first information and the second information are coded by fixed length coding, variable length coding or combination of these.

Further, when the joining direction is selected by checking the number of pixels along the boundary as already described referring to FIG. 3, the joining direction can be determined from the number of pixels in the image. Accordingly, if encoder 103 encodes the number of image pixels, it is not necessary to encode the information indicating the joining direction. On the decoding side, the joining direction can be determined based on the number of pixels.

Encoding the joining method information can be done by determining a specific joining method beforehand, and indicating whether the specific joining method is selected or not, and then presenting the method other than the specific joining method only when the negative answer is obtained. For example, the selectable joining methods are limited to five types (a), (b), (c), (d) and (e) of FIG. 2 while the method (b) has been determined to be the specific joining method. Upon coding, whether (b) is selected or not is indicated first by the first information. When (b) is selected, coding of the joining method information is completed based only on this first information. Only when other than (b) is selected, the second information is used to indicate choice of one from the four types (a), (c), (d) and (e). The first and second information is coded by fixed length coding, variable length coding or combination of these. This coding scheme is useful when a particular joining method is selected at a higher frequency while the others are selected at lower frequencies.

Multiplexer 106 multiplexes the coded data of the joined image and the coded data of the joining method information, producing coded data. Though not illustrated in FIG. 1, if sound and/or music is encoded with the image, the coded data of these is also multiplexed by the multiplexer.

As described heretofore, according to the present embodiment, when a stereo image is encoded after joining, the joining and coding is performed so that high continuity can be kept along the boundary between the left and right images. Therefore, it is possible to realize efficient coding.

Figure 4:
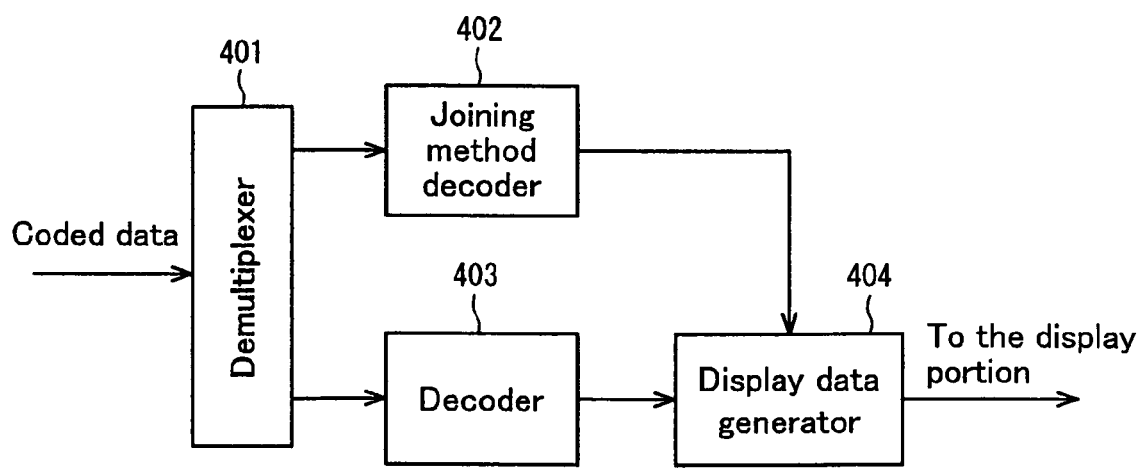
FIG. 4 is a block diagram showing an image decoding apparatus according to the first embodiment of the present invention.

FIG. 4 is a block diagram showing an image decoding apparatus of the first embodiment of the present invention. A demultiplexer 401 is a portion that demultiplexes coded data; a joining method decoder 402 is a portion that decodes the coded data of the joining method information; a decoder 403 is a portion that decodes the coded data of the joined image; and a display data generator 404 is a portion that generates display data from the decoded joined image.

The image decoding apparatus of the first embodiment will be described in detail with reference to the drawing.

Demultiplexer 401 demultiplexes coded data to extract the coded data of the joining method information and the coded data of the joined image. Though not illustrated in FIG. 4, if sound and/or music is encoded with the image, the coded data of these is also demultiplexed by the demultiplexer.

Joining method decoder 402 decodes the coded data of the joining method information to obtain the joining method used when coded. As the decoding scheme, a decoding scheme such as fixed length decoding, variable length decoding or the like, corresponding to the coding method used on the image coding apparatus, is used.

Decoder 403 decodes the coded data of the joined image. As the decoding scheme, a decoding scheme such as JPEG, JPEG2000, MPEG-1, MPEG-2, MPEG-4 or non-standard schemes, corresponding to the coding method used on the image coding apparatus is used.

Display data generator 404 generates display data from the decoded joined image, in accordance with the decoded joining method. For example, stereo images are joined by the joining method (b) of FIG.2 and coded, and when only the right image is displayed on a 2-dimensional display device, the right half of the decoded joined image is inverted so as to produce the original right image, which is used as the data for display. In this case, since the right image is an image, which was sub-sampled with respect to the horizontal direction, the number of pixels in the horizontal direction needs to be doubled by interpolation to achieve actual display. On the other hand, when the left and right images are used to display on a stereo display device, display data is generated in conformity with the display format of the stereo display device.

In this way, display data generator 404 extracts the original left and right images in accordance with the joining method and generates the data for display in conformity with the display format of the display device. As the display device, various types having different display formats can be used, including usual 2-dimensional display devices such as CRTs, LCD panels and the like, and stereo display devices using a lenticular, parallax barrier, liquid crystal shutter or the like. Therefore, the generation process of the display data for each display format will not be described herein.

The coding scheme of the joining method information may further include coding of the first information that indicates whether the joining method has changed from the previous frame and coding of the second information that indicates the joining method. In this case, the second information is coded only when the first information indicates "the joining method has changed from the previous frame". The first and second information is coded by fixed length coding, variable length coding or combination of these.

In decoding the data thus coded, the first information that indicates whether the joining method has changed from the previous frame is decoded first. When the first information indicates "the joining method is unchanged from the previous frame", the joining method for the previous frame is used for that of the current frame. The second information that indicates the joining method is decoded to obtain the joining method of the current frame only when the first information indicates "the joining method has changed from the previous frame".

Description up to here has been made referring to the case of two-view stereo images. However, the present invention can be also applied to stereo multi-view images viewed from three or more viewpoints.

For example, when the number of viewpoints is 3, the image coding apparatus in FIG. 1 operates as follows.

Sub-sampling portion 101 sub-samples the input image to one-third with respect to the horizontal direction.

Figure 5:
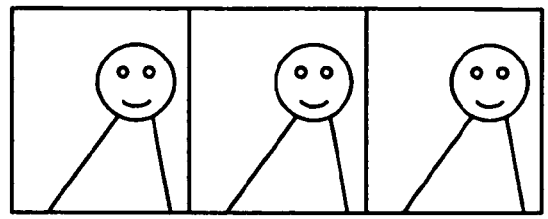
FIG. 5 is an illustrative view showing another example of a joining method of images in the present invention.
Figure 5:
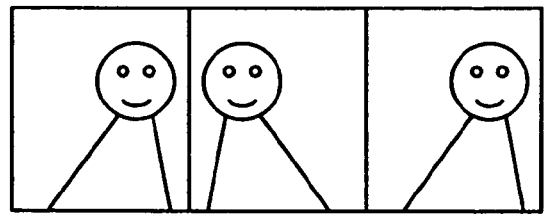
Figure 5:
Figure 5:
Figure 5:
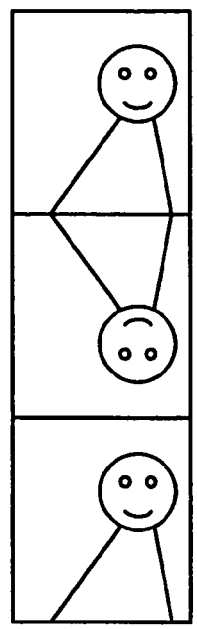
Figure 5:
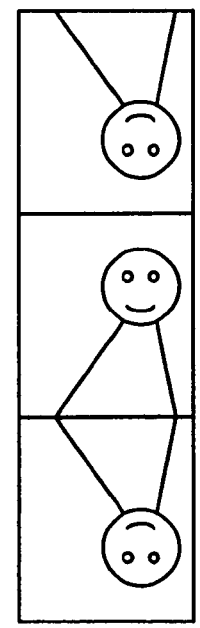

Joining method selector 104 selects the joining method in the same manner as in the two view configuration. As selectable joining methods, those shown in FIG. 5 can be considered.

FIGS. 5(a) to (c) each show three images (sub-sampled to one-third with respect to the horizontal direction) from different viewpoints being joined horizontally, (a) a mode without inversion, (b) a mode with the center image horizontally inverted and (c) a mode with the left and right images horizontally inverted. FIGS. 5(d) to (f) each show three images from different viewpoints being joined vertically, (d) a mode without inversion, (e) a mode with the center image vertically inverted and (f) a mode with the top and bottom images vertically inverted.

Selection of the joining method can be made based on the number of pixels or continuity at the boundary as described for the two view configuration. Alternatively, selection may be done by assigning, for example, the mode shown in FIG. 5(b), previously and changing to another joining method only when a request is made from the user.

Joining portion 102 joins three images in accordance with the selected joining method. Encoder 103, joining method encoder 105 and multiplexer 106 operate in the same manner as in the two view configuration.

In the case of three viewpoints, the image decoding apparatus of FIG. 4 operates as follows.

Demultiplexer 401, decoder 403 and joining method decoder 402 operate in the same manner as in the two view configuration.

Display data generator 404 separates the decoded image into three images from different viewpoints, in accordance with the joining method obtained by joining method decoder 402, and generates display data in conformity with the format of the stereo display device.

Also in the configuration including four or more viewpoints, coding and decoding of stereo images is done in the same manner as described above.

The Second Embodiment

Next, the second embodiment of the present invention will be described. In the first embodiment, the input images viewed from different viewpoints are input time-sequentially. In the second embodiment, the input images viewed from different viewpoints can be input in parallel.

Figure 6:
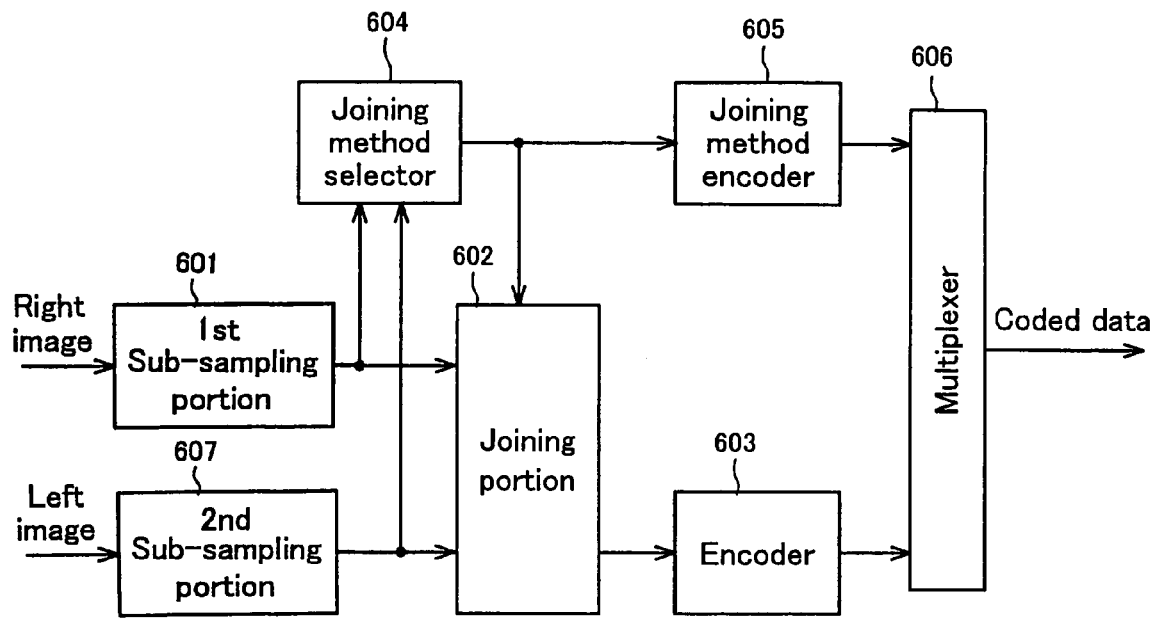
FIG. 6 is a block diagram showing an image coding apparatus of the second embodiment of the present invention.

FIG. 6 is a block diagram showing an image coding apparatus of the second embodiment. A first sub-sampling portion 601 and second sub-sampling portion 607 are portions that sub-sample image data; a joining portion 602 is a portion that joins the sub-sampled images of data; and a joining method selector 604 is a portion that selects the image data joining method from multiple joining methods. An encoder 603, a joining method encoder 605 and a multiplexer 606 provide the same functions as in the configuration of FIG. 1, so that description is omitted herein.

First sub-sampling portion 601 sub-samples the input right image and second sub-sampling portion 607 sub-samples the input left image. The manner of sub-sampling is the same as the first embodiment.

Joining method selector 604 selects a joining method of the sub-sampled left image and the sub-sampled right image. Joining portion 602 joins the sub-sampled left image and the sub-sampled right image, in accordance with the selected joining method. The selection process of the joining method and the joining process are effected in the same manner as in the first embodiment. The difference from the first embodiment resides in that the left and right images both sub-sampled with respect to the horizontal direction are input in parallel as the input data to joining method selector 604 and joining portion 602.

The configuration of an image coding apparatus in the above way makes it possible to lessen the delay of the coding process compared to the case where the images from different viewpoints are input time-sequentially.

Since the characteristics of the second embodiment relates to image coding apparatuses, description of the image decoding apparatus is omitted. The coded data created by the image coding apparatus of the second embodiment can be decoded by the image decoding apparatus of the first embodiment.

The Third Embodiment

Next, the third embodiment of the present invention will be described. This embodiment is characterized by linking the selecting process of the joining method with the coding process.

Figure 7:
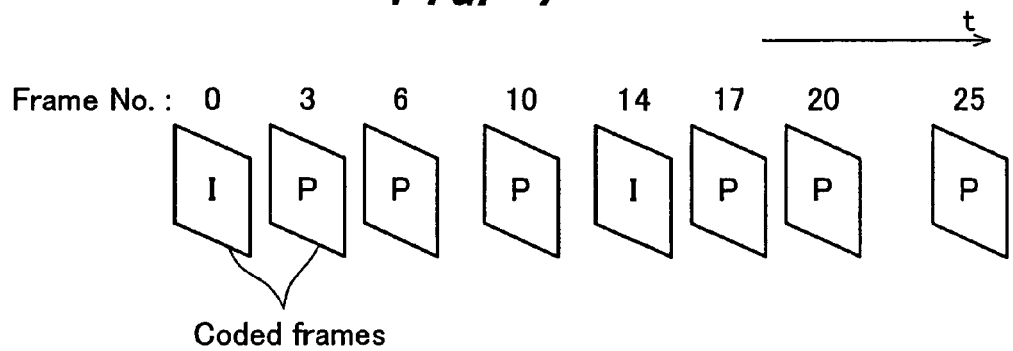
FIG. 7 is a block diagram showing an example of encoding of a movie.

FIG. 7 is a diagram showing an example of coding a movie. Here, the figures represent the frame numbers of the frames. The symbol added to each coded frame represents the type of coding. Specifically, I indicates that the frame is coded by intra-frame coding, P indicates that the frame is coded by inter-frame coding.

In the example of FIG. 7, frame 0 is coded by intra-frame coding, frames 1 and 2 are omitted without being coded, frame 3 is coded by inter-frame coding. Similarly, frames 6 and 10 are coded by inter-frame coding, and frame 14 is coded next by intra-frame coding.

It is wasteful to effect a selection process of the joining method every frame in a coding scheme entailing frame-skipping. Therefore, in the third embodiment, in the image coding apparatus of FIG. 1 (or FIG. 6), joining method selector 104 (or 604) is adapted so as not to effect the selecting process for the frames omitted by encoder 103 (or 603) and so as to effect the selecting process only for the frames actually encoded.

Further, in the coding scheme as in FIG. 7, in which both intra-frame coding and inter-frame coding are practiced, change of the joining method every coded frame by selection of the joining method results in lowering of coding efficiency. In the case of FIG. 7, if the joining method of FIG. 2(*a*) is selected for frame 3 and the joining method of FIG. 2(*b*) is selected for frame 6, the right half of frame 6 significantly differs from the right half of frame 3, so that the prediction efficiency of inter-frame prediction lowers. Alternatively, if the joining method of FIG. 2(*a*) is selected for frame 3 and the joining method of FIG. 2(*d*) is selected for frame 6, the numbers of horizontal and vertical pixels of the image of frame 6 differ from those of frame 3. Therefore, in an international standard scheme such as MPEG-4, these frames need to be coded by regarding them as different sequences hence this results in being unfeasible. Accordingly, in the third embodiment, the selecting process of the joining method, hence joining method change is permitted for the intra-frame coded frames only, whereas inter-frame coded frames that follow them are not changed in selection method.

Alternatively, the selecting process of the joining method may be effected for the frames that are actually coded: when the joining method is unchanged, either intra-frame coding or inter-frame coding is effected whereas only intra-frame coding is effected when the joining method is changed.

In the above way, in the third embodiment, synchronous selection of the joining method with coding and synchronous change of the joining method with that of the coding method enables reduction of the processing volume and improvement of the coding efficiency.

Since the above-described characteristics of the third embodiment relate to image coding apparatuses as in the situation of the second embodiment, detailed description of the image decoding apparatus is omitted. The coded data created by the image coding apparatus of the third embodiment can be decoded by the image decoding apparatus of the first embodiment.

However, in the third embodiment, if the coding scheme of the joining method information is made different from that of the first embodiment or the second embodiment, an image decoding apparatus matching the configuration of the third embodiment is needed.

For example, in the image coding apparatus of the third embodiment, when joining method information is added to the limited coded frames (intra-frame coded frames, the coded frame at the lead of a sequence) only while the other coded frames are coded using the same joining method as that of the previous frame, the image decoding apparatus is also adapted, in accordance with the configuration, to decode the joining method for the aforementioned limited coded frames only while for the other coded frames their display data is prepared in the same joining method as that of the previous frame.

Figure 8:
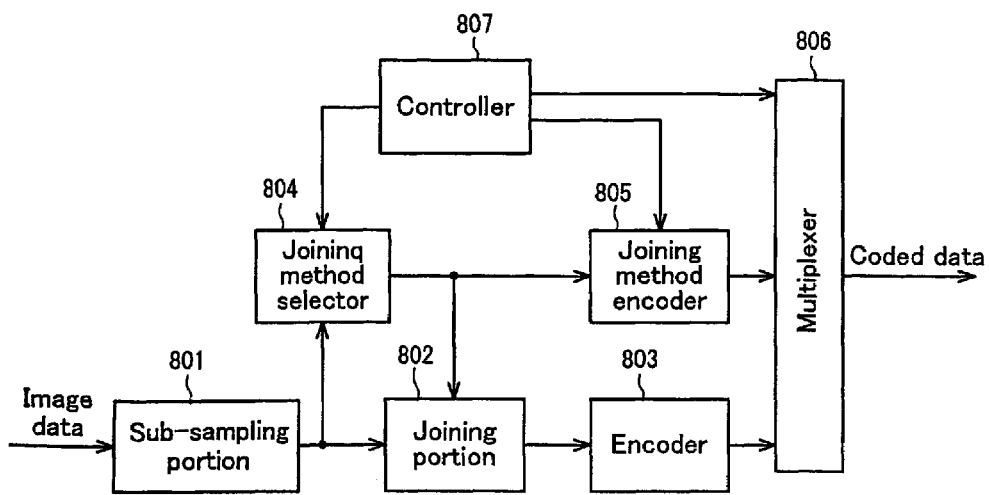
FIG. 8 is a block diagram showing an image coding apparatus of the third embodiment of the present invention.

FIG. 8 is a block diagram showing this image coding apparatus. The difference from FIG. 1 is that a controller 807 is provided so as to control a joining method selector 804, an encoder 803, a joining method encoder 805 and a multiplexer 806. Joining method encoder 805 is a portion that encodes the information of the selected joining method. A sub-sampling portion 801 and a joining portion 802 operates in the same manner as in FIG. 1.

Controller 807 is a portion that determines the frames to be intra-frame coded and controls the operations of joining method selector 804, encoder 803, joining method encoder 805 and multiplexer 806. Controller 807 controls joining method selector 804 so as to select the joining method for the frames determined above only. Controller 807 also controls encoder 803 so that the frames determined above are intra-frame coded. Further, controller 807 controls joining method encoder 805 so that the joining method information is coded for the frames determined above only.

Multiplexer 806 adds joining method information at the leads of the coded data of the frames that were determined by controller 807. Here, the coded data of joining method information may be multiplexed within the coded data of the movie data, or when the coded data of the movie data is packetized by the multiplexer, the coded data of joining method information is added to the header information of each packet.

When the coded data of joining method information is always added at the lead of the intra-frame coded data of each frame as stated above, it is possible to judge whether there is the coded data of joining method information, by checking whether the frame was intra-frame encoded or not. However, when the coded data of joining method information is added to part of the intra-frame coded data only, it is necessary to separately provide the information as to whether the coded data of joining method information is present or not. For this purpose, a one-bit flag, for example, can be used so as to indicate whether the coded data of joining method information is present or not.

Figure 9:
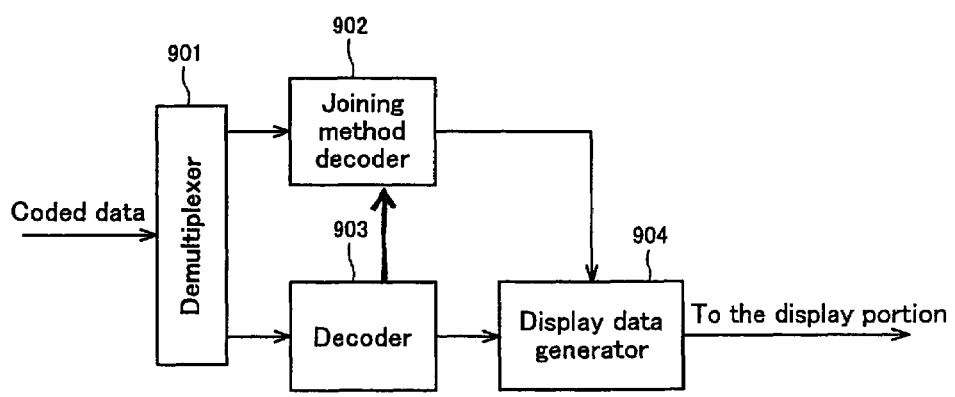
FIG. 9 is a block diagram showing an image decoding apparatus of the third embodiment of the present invention.

FIG. 9 is a block diagram showing an image decoding apparatus for decoding the coded data from the image coding apparatus of FIG. 8. FIG. 9 shows the case where the coded data of joining method information is always added at the lead of each piece of intra-frame coded data.

The difference from FIG. 4 is that control information is input from a decoder 903 to a joining method decoder 902. A demultiplexer 901 and a display data generator 904 function in the same manner as in FIG. 4.

While decoding the coded data of a movie, decoding apparatus 903 supplies a piece of control information to joining method decoder 902 when the intra-frame coded data is being decoded. This control information is an indicator that informs joining method decoder 902 of the fact that intra-frame coded data is being decoded. Joining method decoder 902 operates to decode the coded data of joining method information only when intra-frame coded data is being decoded. The joining method information decoded by joining method decoder 902 is supplied to display data generator 904, where it is used to generate display data of the decoded joined image. In this way, it is possible to decode the coded data efficiently when the joining method is selected for intra-frame coded data.

In a case where, in multiplexer 806 in the image coding apparatus of FIG. 8, the coded data of joining method information is multiplexed with time information corresponding to intra-frame coded data, the control information described with FIG. 9 may be sent from demultiplexer 901 to joining method decoder 902. Illustratively, since the time information corresponding to intra-frame coded data can be also obtained when demultiplexer 901 demultiplexes the coded data, the demultiplexer is able to judge whether decoder 903 is decoding intra-frame coded data. When demultiplexer 901 has determined that intra-frame coded data is being decoded, it sends the control information to joining method decoder 902.

In the case where, at coding, the coded data of the joining method information is not added to all of intra-frame coded data but is only added to part of the intra-frame coded data, it is necessary to separately encode the information that indicates whether the coded data of joining method information is present or not. For example, this information may be multiplexed in multiplexer 806 of FIG. 8. Correspondingly, the image decoding apparatus decodes this information. For example, the information that indicates whether the coded data of joining method information is present or not is separated by demultiplexer 901, and this is input to an unillustrated controller. The controller, based on this information, can control joining method decoder 902 so as to decode the coded data of joining method information only when the coded data of joining method information is present.

The Fourth Embodiment

Next, the fourth embodiment of the present invention will be described. This embodiment is characterized by use of a technique of shifting the images when images from different viewpoints are joined in order to reduce the influence from parallax.

Figure 10:
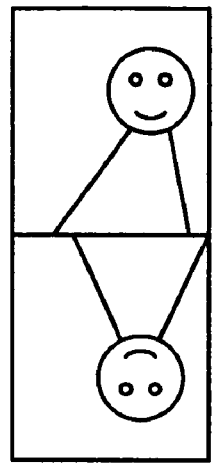
FIG. 10 is an illustrative view showing the influence of parallax appearing when joining.
Figure 11:
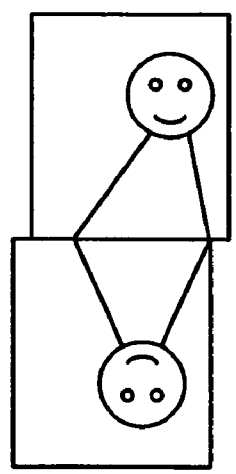
FIG. 11 is an illustrative view showing a shift for reducing the influence of parallax shown in FIG. 10.

FIG. 10 shows an example of the influence from parallax in the joining method of FIG. 2(e). Since a typical stereo image involves parallax between the images from different viewpoints, there exists part having pixel value discontinuity at the boundary between the images even when the images are joined with the right image inverted as shown in FIG. 2(e). FIG. 11 is an illustration in which the images are joined with the right image inverted and shifted in order to lessen the discontinuous part of FIG. 10.

Figure 12:
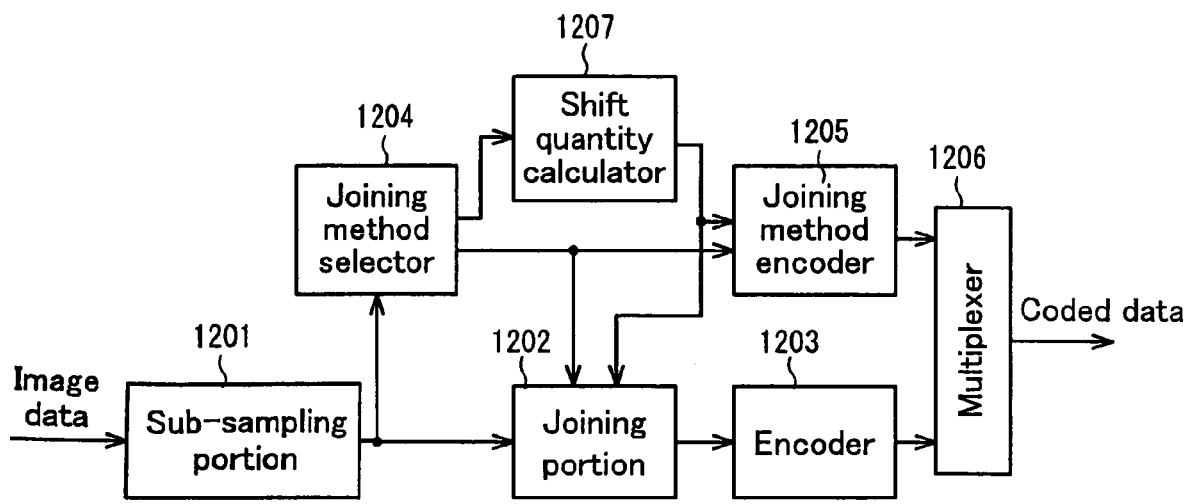
FIG. 12 is a block diagram showing an image coding apparatus of the fourth embodiment of the present invention.

FIG. 12 is a block diagram showing an image coding apparatus according to the fourth embodiment. This is compared to a configuration of FIG. 1 where a shift quantity calculator 1207, which is the characteristic of this embodiment, is added downstream of joining method selector 104. A joining portion 1202 is a portion that joins the sub-sampled images of data; a joining method selector 1204 is a portion that selects an image data joining method from a plurality of joining methods; and a joining method encoder 1205 is a portion that encodes the selected joining method and the shift quantity data. A sub-sampling portion 1201, an encoder 1203 and a multiplexer 1206 operate in the same manner as in the configuration of FIG. 1, so that description is omitted. It is also possible to realize the fourth embodiment by adding a shift quantity calculator downstream of joining method selector 604 of FIG. 6 or joining method selector 804 of FIG. 8 in the same manner as FIG. 12. However, description of these is also omitted herein.

Shift quantity calculator 1207 of FIG. 12 is a portion that determines the shift quantity at joining. For example, a plurality of shift quantities and corresponding image joining methods are previously determined. When joining, the discontinuity at the boundary is calculated for each shift quantity so as to determine the shift quantity with which the discontinuity becomes minimum. The calculating method of the discontinuity is the same as that described for joining method selector 104 of FIG. 1.

Figure 13:
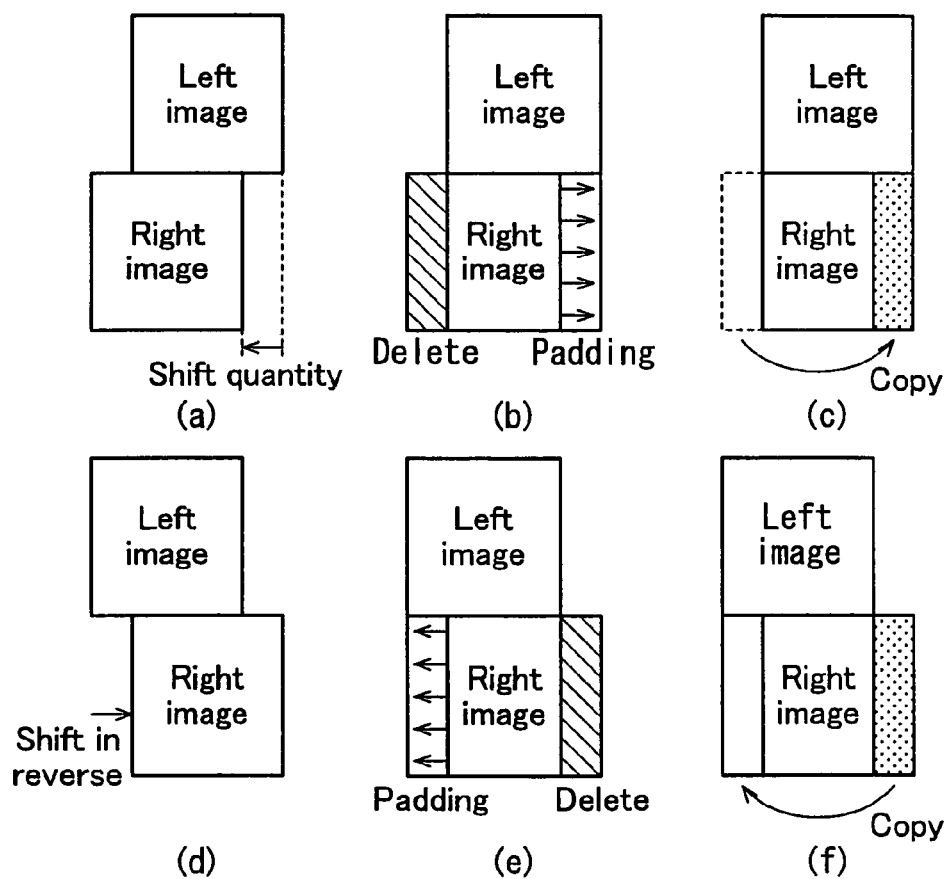
FIG. 13 is an illustrative view showing the process performed with the shift shown in FIG. 11.

FIG. 13 shows examples of joining methods for different shifts. FIG. 13(a) shows a case where the bottom side image is shifted left when the images are joined top and bottom. Since in the actual image coding apparatus, the image of a square shape is encoded, the joined image is made square forming a square image (this process is hereinbelow called "squaring") by deleting the leftward bulge and padding the right side as shown in FIG. 13(b) or by copying the leftward bulge to the right side as shown in FIG. 13(c). Padding in FIG. 13(b) may be done by copying the pixel values along the right edge, rightward, pixel by pixel; folding back the pixel values with respect to the right edge; padding a predetermined pixel value on the right side; or other methods. Copying in FIG. 13(c) may be done by directly copying the leftward bulge, by copying the leftward bulge after horizontal inversion or by other ways.

When, in the case of FIG. 13(b), the predetermined pixel value is padded, or when copying is done in the case of FIG. 13(c), pixel value discontinuity occurs near the right edge of the lower part of the image. Therefore, it is necessary to consider the influence from this discontinuity to make choice of whether the shift should be done or not. For this, the calculation of the discontinuity index should include the discontinuous portion near the right edge.

In the above description, the case where the bottom side image is shifted left as shown in FIG. 11 was described. However, this technique can be applied to the case where the bottom side image is shifted right. In this case, the joined image is squared by some method such as deleting the rightward bulge and padding the lacking part on the left side. Further, this technique can be also applied to the case where the right and left images are joined by arranging them horizontally. In this case, a vertical shift is made, and the joined image is squared by deleting the upward or downward bulge and padding the lacking part at the top or bottom.

Joining method selector 1204 in FIG. 12 makes a choice from the joining methods in the same manner as joining method selector 104 of FIG. 1. The selected joining method is sent to joining portion 1202 and joining method encoder 1205.

Joining portion 1202 in FIG. 12 joins the images in accordance with the joining method selected by joining method selector 1204, using the shift quantity determined by shift quantity calculator 1207. Joining method encoder 1205 encodes the joining method information and the shift quantity data. Coding of joining method information is done in the same manner as in the first embodiment. The shift quantity data is encoded by fixed length coding, variable length coding or the like.

If squaring can be done by making a choice from a plurality of methods, for example, any of FIG. 13(*b*) or (*c*) can be adaptively selected, the information that indicates how the data after shifting was squared is separately coded by joining method encoder 1205.

Figure 14:
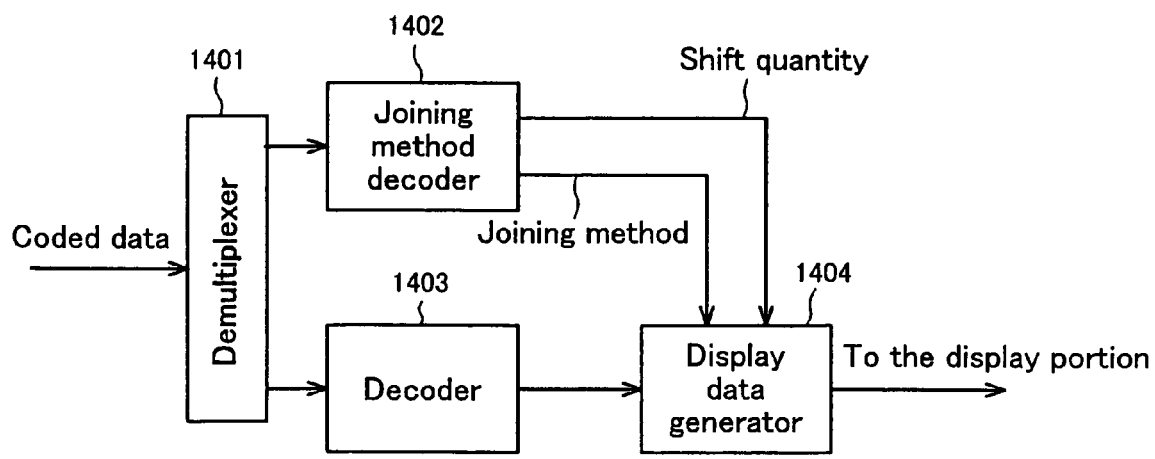
FIG. 14 is a block diagram showing an image decoding apparatus of the fourth embodiment of the present invention.
Figure 15:
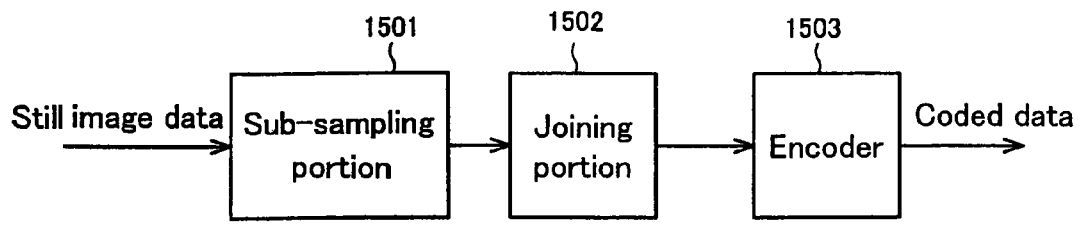
FIG. 15 is a block diagram showing a conventional image coding apparatus.
Figure 16:
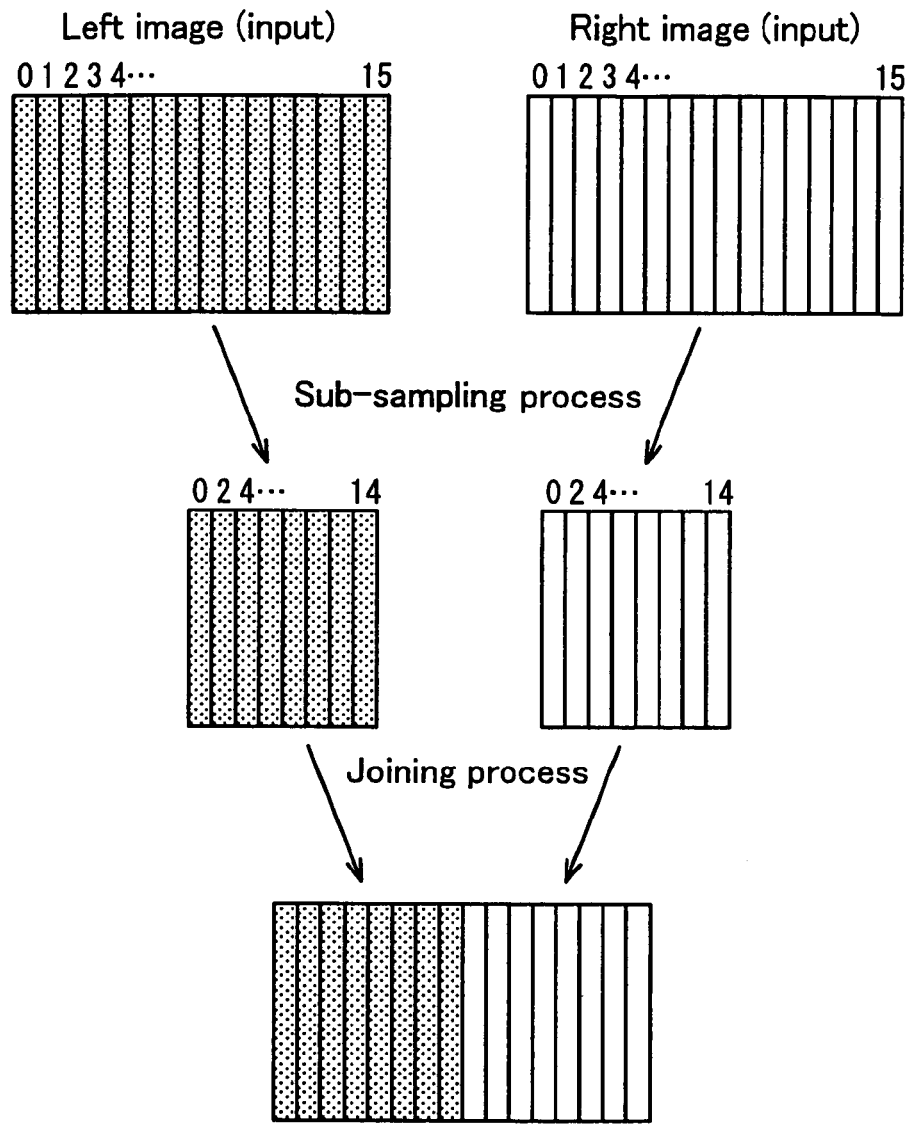
FIG. 16 is an illustrative view showing a sub-sampling process and joining process in a conventional image coding apparatus.
Figure 17:
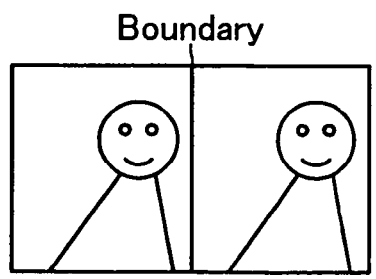
FIG. 17 is an illustrative view showing a conventional joining method and its problem.

FIG. 14 is a block diagram showing an image decoding apparatus according to the fourth embodiment. A joining method decoder 1402 is a portion that decodes the coded data of the joining method and shift quantity; and a display data generator 1404 is a portion that generates display data from the decoded joined image. A demultiplexer 1401 and a decoder 1403 operate in the same manner as in FIG. 4, so that description is omitted.

Joining method decoder 1402 decodes the joining method and the shift quantity. Decoding of the joining method is done in the same manner as in the first embodiment. The shift quantity is decoded by fixed length decoding, variable length decoding or the like. When squaring of the shifted image can be done by making a choice from a plurality of methods, the information that indicates how the image was squared is also decoded by joining method decoder 1402, and transferred to display data generator 1404.

Display data generator 1404 generates the display data to be output to the display device based on the decoded joining method, shift quantity and the information that indicates how the image was squared, as required. This time, the right image is shifted in the opposite direction to that when encoded, as shown in FIG. 13(*d*). Then, the shifted image on the coding side is reverted back to the original in accordance with the squaring manner.

For example, when the image was squared in the manner shown in FIG. 13(*b*), the part of data on the right side of the right image is deleted as shown in FIG. 13(*e*), and the part on the left side is filled up with padding data. When this image is displayed on the stereo display device, the part filled up by padding cannot be viewed stereoscopically. Therefore, it is necessary to add some process such as replacing the part that cannot be viewed stereoscopically on both the left and right images with common pixel data.

When the image was squared in the manner shown in FIG. 13(*c*), the part of data on the right side of the right image is copied to the left side as shown in FIG. 13(*f*) so as to restore the original right image.

As has been described, according to the fourth embodiment, by estimating the shift quantity that minimizes the influence from parallax when the images are joined, it is possible to realize an image coding and decoding scheme which is able to keep high continuity at the boundary in the joined image and hence achieve a high coding efficiency.

The Fifth Embodiment

Next, the fifth embodiment of the present invention will be described. This embodiment is characterized by obtainment of an identical output result between different image decoding apparatuses when a plurality of images of data corresponding to different viewpoints are displayed two-dimensionally in a plurality of image decoding apparatuses.

Figure 18:
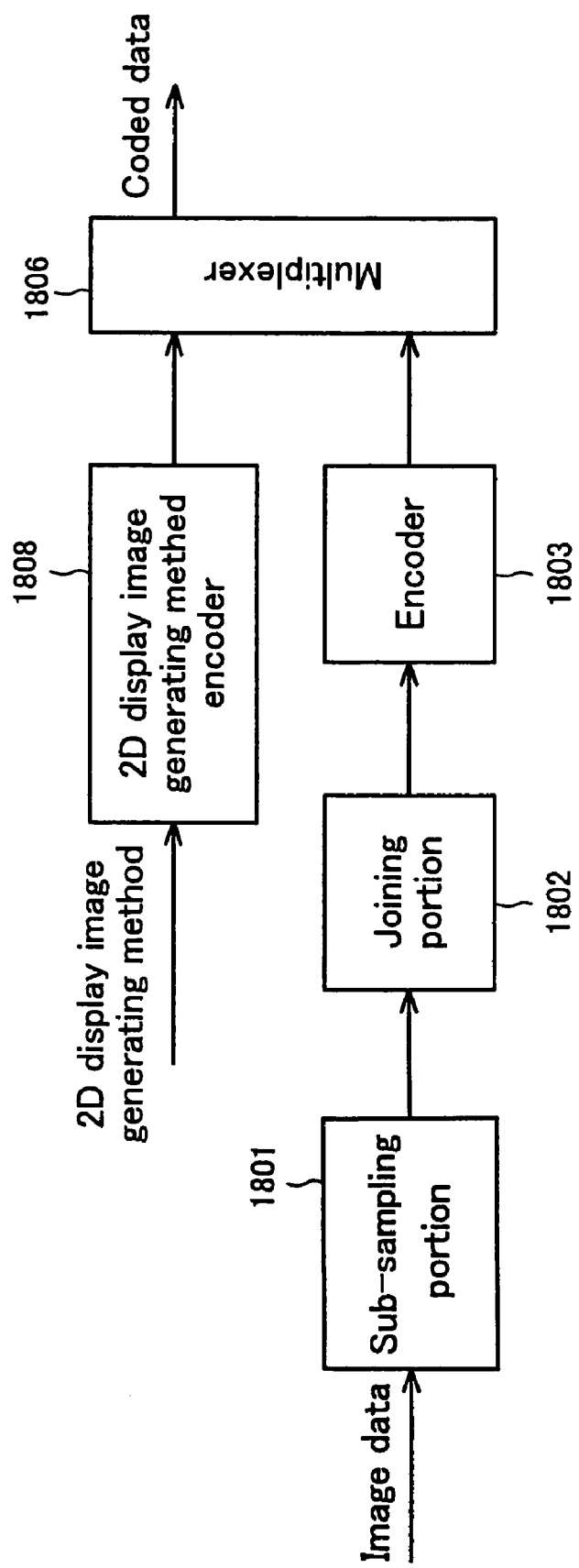
FIG. 18 is a block diagram showing an image coding apparatus of the fifth embodiment of the present invention.

FIG. 18 is a block diagram showing an image coding apparatus according to the fifth embodiment. A sub-sampling portion 1801 is a portion that sub-samples image data; a joining portion 1802 is a portion that joins the sub-sampled images of data in a predetermined joining manner; an encoder 1803 is a portion that encodes the joined image data; a 2-dimensional display image generating method encoder 1808 is a portion that encodes the method of generating a display image for 2D display (to be referred to as 2D display image) from the joined image data; and a multiplexer 1806 is a portion that multiplexes the encoded image data and the encoded 2D display image generating method to generate coded data. Sub-sampling portion 1801 and encoder 1803 provide the same functions as in FIG. 1, so that description is omitted herein.

Now, the image coding apparatus of the fifth embodiment will be described in detail with reference to the drawings.

Figure 19:
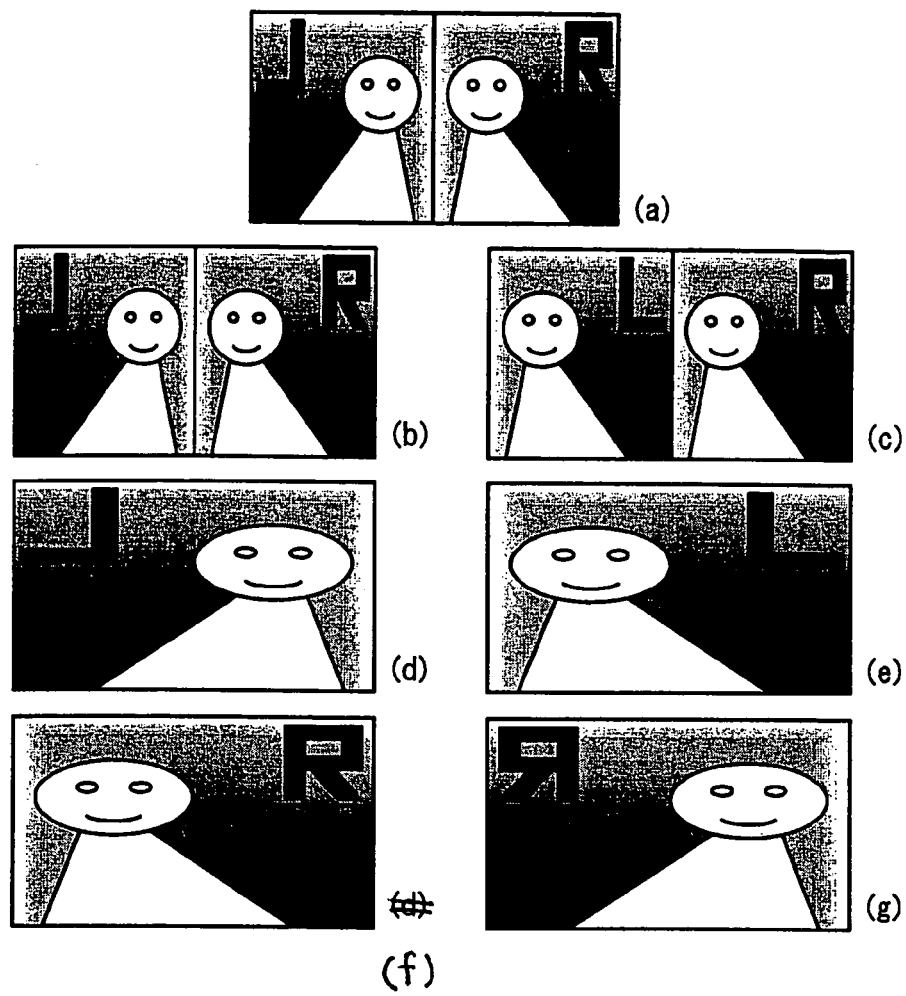
FIG. 19 is an illustrative view showing an example of a 2-dimensional display image generating method in the present invention.

Joining portion 1802 joins the sub-sampled images of data. The difference from the joining portion 102 of FIG. 1 is that the joining process is implemented in the previously determined manner, not designated externally by joining method selector 104 or the like. FIG. 19(*a*) shows an example of joined image data formed by joining portion 1802. The predetermined joining method adopted here in joining portion 1802 is that in which the left image is horizontally inverted and the right image is arranged on the right side. However, the method should not be limited to this, and other methods described in the foregoing embodiments can be also used.

FIGS. 19(*b*) to (*g*) show examples of 2D display images generated from the joined image of data shown in FIG. 19(*a*). For example, in the case of FIG. 19(*b*), the joined image data is directly used as the 2D display image. In the case of FIG. 19(*c*), only the left half of the joined image of data is inverted horizontally and the resulting image is used as the 2D display image. In the case of FIG. 19(*d*), only the left half of the joined image of data is extracted and extended two times in the horizontal direction, and the resulting image is used as the 2D display image. Description of the generating methods of FIGS. 19(*e*) to (*g*) is omitted, but various methods of generating a 2D display image from the joined image data for stereo display device can be considered.

2D display image generating method encoder 1808 is a portion that encodes the information of the 2D display image generating method, i.e., how the 2D display image is generated from the joined image data. If the 2D display image generating method is not particularly specified, the information indicating that status may be encoded as the 2D display image generating method.

Multiplexer 1806 multiplexes the coded joined image and the coded 2D display image generating method to output coded data.

The coded data thus generated is demultiplexed, and the extracted joined image and the 2D display image generating method are used to prepare a 2D display image, whereby it is possible to obtain an identical output result between different image decoding apparatuses. Next, the image decoding apparatus of the fifth embodiment will be described.

Figure 20:
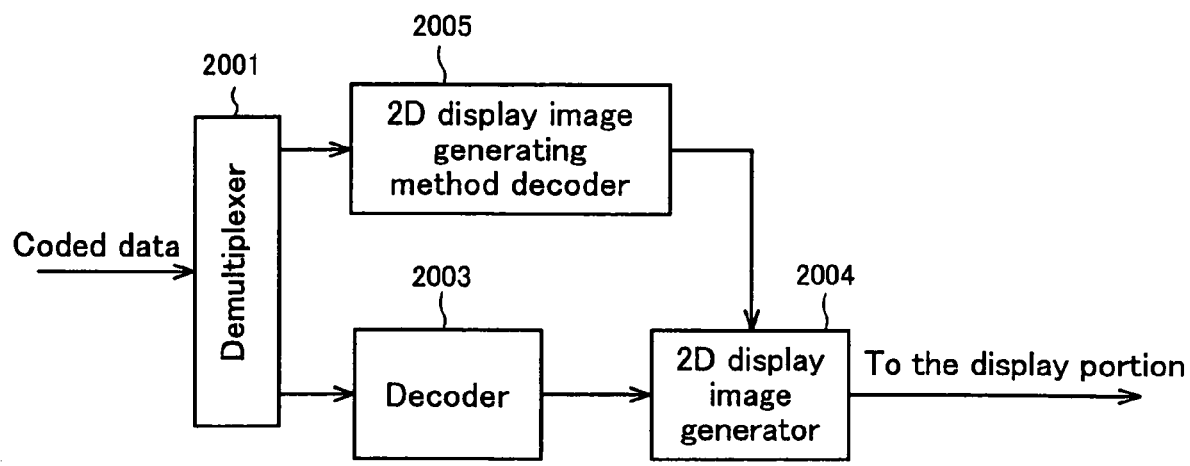
FIG. 20 is a block diagram showing an image decoding apparatus of the fifth embodiment of the present invention.

FIG. 20 is a block diagram showing an image decoding apparatus according to the fifth embodiment. A demultiplexer 2001 is a portion that demultiplexes coded data to extract the coded joined image and the coded 2 D display image generating method; a decoder 2003 is a portion that decodes the coded joined image; a 2D display image generating method decoder 2005 is a portion that decodes the coded 2D display image generating method; a 2D display image generator 2004 is a portion that generates a 2D display image to be output on the display portion, based on the decoded joined image and the decoded 2D display image generating method. Decoder 2003 functions in the same manner as in FIG. 4, so that description is omitted here.

The coded data is separated by demultiplexer 2001 into the coded joined image and the coded 2D display image generating method. The coded joined image is decoded by decoder 2003 while the coded 2D display image generating method is decoded by 2D display image generating method decoder 2005. Two-dimensional display image generator 2004 generates a 2D display image from the decoded joined image, in accordance with the decoded 2D display image generating method. Since the generated 2D display image is generated in the definite manner based on the rule defined by the 2D display image generating method, it is possible to obtain a display result that is independent of the decoding apparatus.

Here, if the 2D display image generating method is not particularly specified to be a definite 2D display image generating method, the 2D display image is determined to be generated based on the 2D display image generating method dependent on the image decoding apparatus. In this case, it is impossible to obtain an identical display result between image decoding apparatuses, but the 2D display image is generated as before, in a manner suited to each image decoding apparatus and can be displayed.

As has been described, according to the present embodiment, when a stereo image is encoded after joining, the 2D display image generating method is also encoded so that the coded data is multiplexed. At decoding, the 2D display image is generated from the joined image based on the 2D display image generating method designated at encoding. As a result it is possible to obtain the identical 2D display image that is not dependent on the image decoding apparatus.

The present configuration is also effective in displaying thumbnails arranged as a menu when coded stereo images and 2D images are recorded together on a recording medium. For example, for a stereo image the 2D display image generating method can be coded and multiplexed so as to display the left and right images laid out side by side as shown in FIG. 19(c), and a 2D display image can be generated based on this information at decoding so as to be displayed as a thumbnail. For a 2D image the image obtained by decoding may be simply reduced in size and displayed. Thus it is possible to distinguish whether an image is recorded stereoscopically or 2-dimensionally, by just glancing at the menu.

Figure 21:
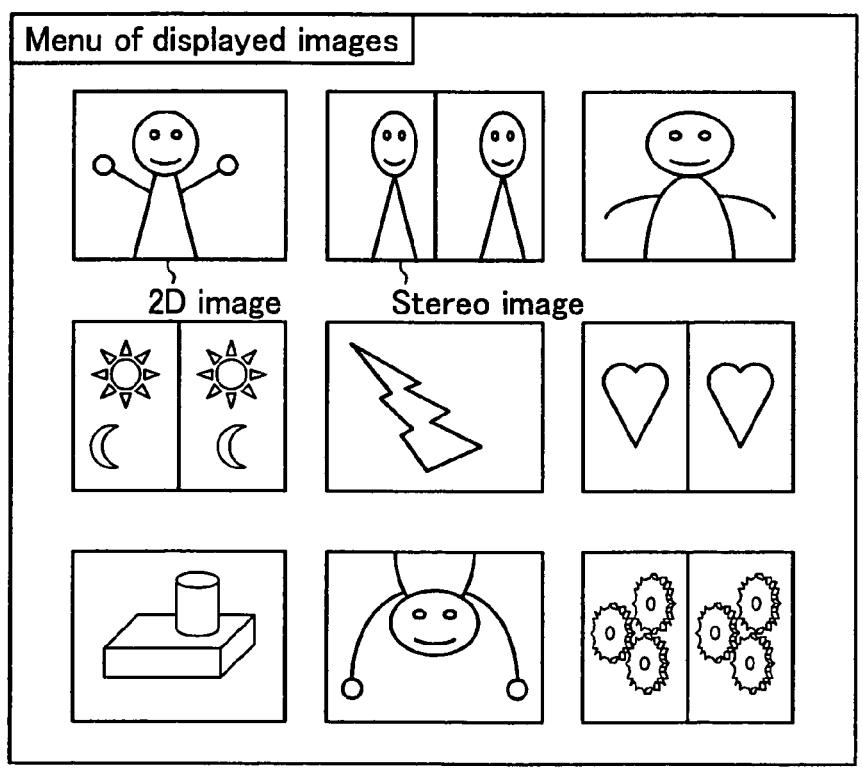
FIG. 21 is an illustrative view showing an example of a menu display of stereo images and 2D images in the present invention.
Figure 22:
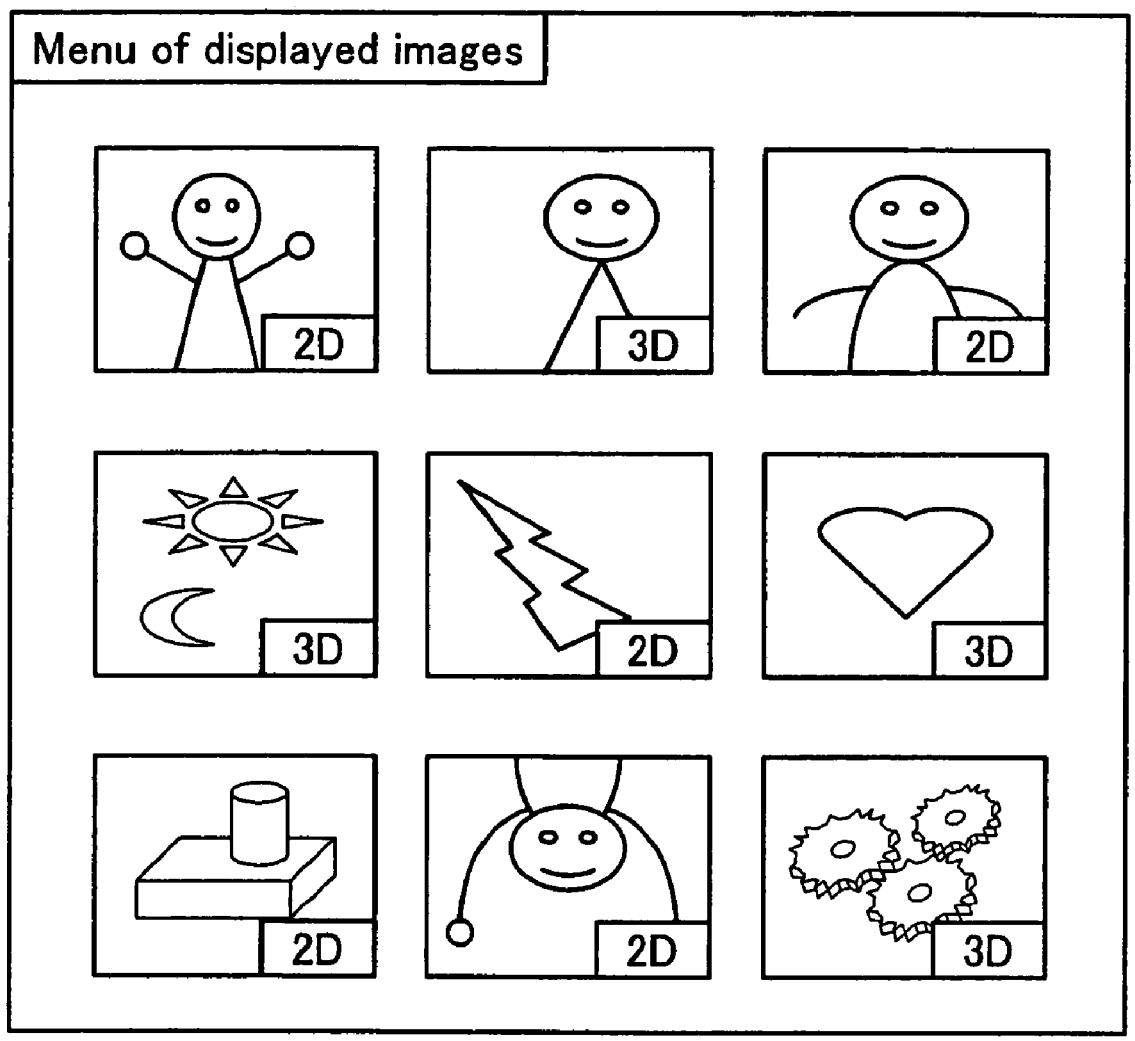
FIG. 22 is an illustrative view showing another example of a process for deciding a 2D display image generating method from the joined image in the present invention.

FIG. 21 shows an image in a menu representation using the present technique when stereo images and 2D images are stored together on a medium. Alternatively, for a stereo image, a 2D display image made of the left image only as shown in FIG. 19(e) may be displayed in a reduced size with a mark indicating a stereo image affixed to the thumbnail image. For a 2D image the image obtained by decoding may be simply reduced in size with a mark indicating a 2D image affixed to the thumbnail image in the same manner as for a stereo image. FIG. 22 shows the image of the menu representation in this case. Here "3D" represents a stereo image and "2D" represents a two-dimensional image. If a menu representation that makes no distinction between stereo images and 2D images is wanted, the marks for representing the entities of stereo images and 2D images can be omitted.

When the 2D display image generating method is used for thumbnail display purpose only, this information can be coded as the thumbnail generating method.

The encoder and decoder of the above 2D display image generating method is effective if it is added to the image coding apparatuses and image decoding apparatuses of the first to fourth embodiments. An example of application to the first embodiment will be described hereinbelow, but application can be made in the same manner to the second to fourth embodiments.

Figure 23:
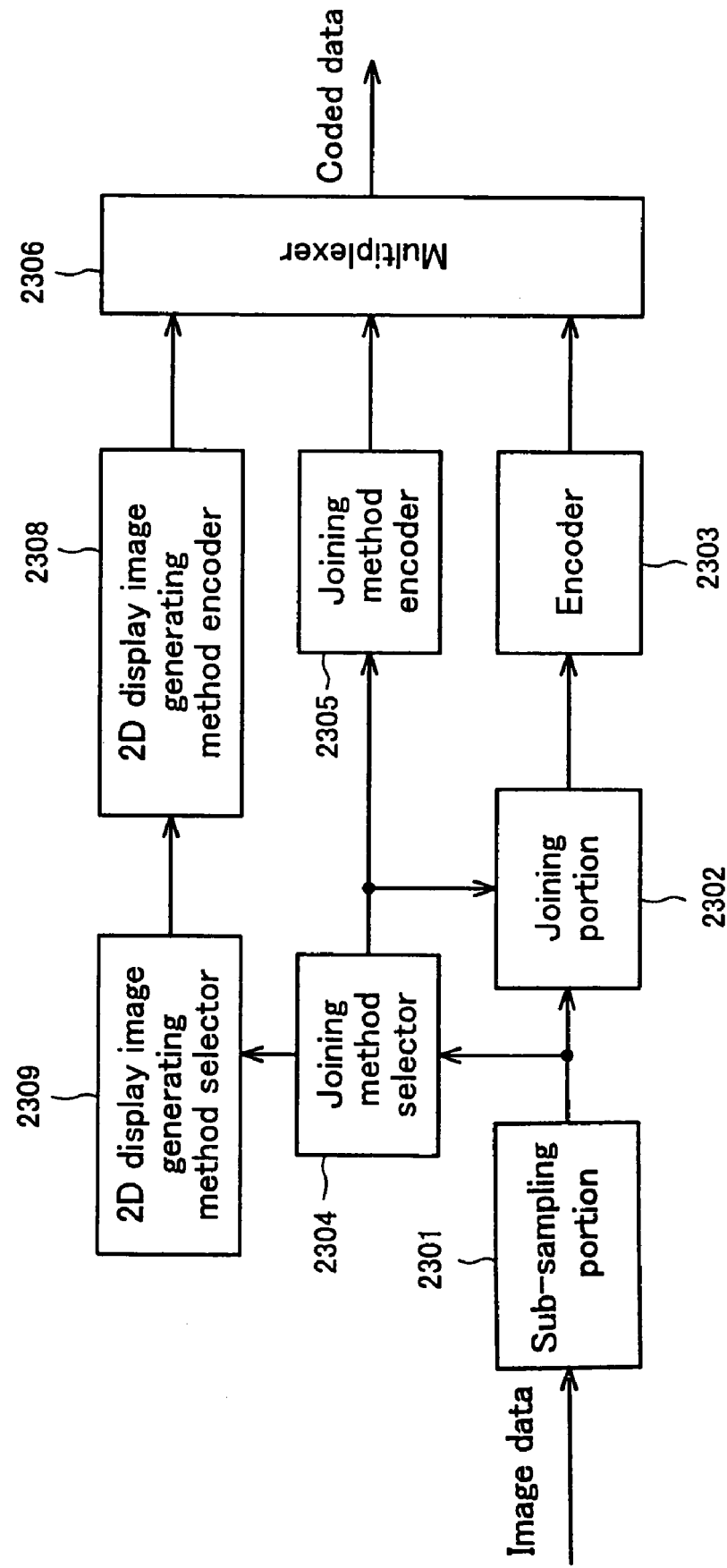
FIG. 23 is another block diagram showing an image coding apparatus of the fifth embodiment of the present invention.

FIG. 23 is another block diagram showing an image coding apparatus according to the fifth embodiment. A sub-sampling portion 2301 is a portion that sub-samples image data; a joining portion 2302 is a portion that joins the left and right images sub-sampled by sub-sampling portion 2301; an encoder 2303 is a portion that codes the joined image data; a joining method selector 2304 is a portion that chooses the image data joining method from a plurality of joining methods; a joining method encoder 2305 is a portion that codes the information of the selected joining method; a 2D display image generating method selector 2309 is a portion that chooses from a plurality of 2D display image generating methods; a 2D display image generating method encoder 2308 is a portion that codes the 2D display image generating method; and a multiplexer 2306 is a portion that multiplexes the coded image data, the coded joining method and coded 2D display image generating method to produce coded data. Sub-sampling portion 2301, joining portion 2302, encoder 2303, joining method selector 2304 and joining method encoder 2305 provide the same functions as in FIG. 1. Further, 2D display image generating method encoder 2308 provides the same function as in FIG. 18, so that description is omitted herein.

Two-dimensional display image generating method selector 2309 determines how a 2D display image is generated from the joined image data, based on the image data joining method selected by joining method selector 2304. One example of the process for determining the generating method of the 2D display image based on the image data joining method will be described. The joined images shown in FIGS. 24(a) to (c) are assumed to be obtained by respective predetermined methods while the image shown in FIG. 24(d) is assumed to be the wanted 2D display image to be generated. Generation of the image of FIG. 24(d) from that of FIG. 24(a) is done by simple duplication of the joined image. Generation of the image of FIG. 24(d) from that of FIG. 24(b) is done by horizontal inversion of the left image portion of the joined image and direct duplication of the right image. Generation of the image of FIG. 24(d) from that of FIG. 24(c) is done by simple duplication of the left image of the joined image and horizontal inversion of the right image. In this way, once the joining method is determined, the method of generating the predetermined 2D display image can be determined definitely. As for the rest, the thus obtained 2D display image generating method is coded by 2D display image generating method encoder 2308, so that on multiplexer 2306, the coded data is multiplexed together with the coded joining method from joining method encoder 2305 and the coded joined image from encoder 2303 to complete coded data.

Here, instead of providing a 2D display image generating method selector 2309, a 2D display image generating method may be input externally, similarly to the configuration shown in FIG. 18.

Figure 25:
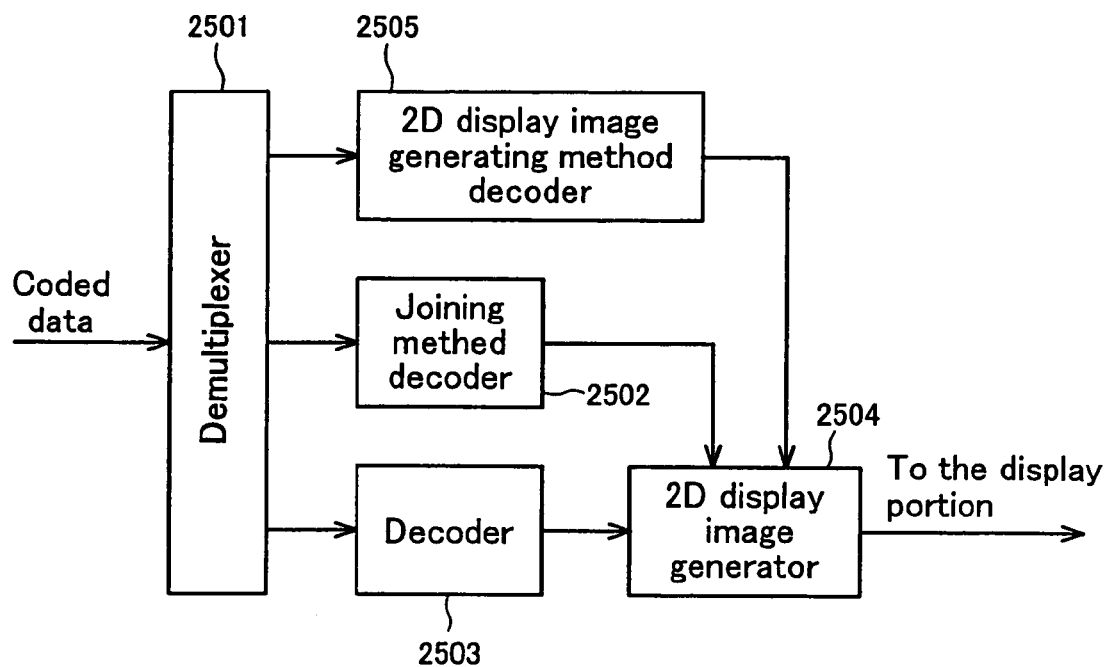
FIG. 25 is another block diagram showing an image decoding apparatus of the fifth embodiment of the present invention.

FIG. 25 is another block diagram showing an image decoding apparatus according to the fifth embodiment. A demultiplexer 2501 is a portion that demultiplexes coded data to extract the coded joined image and the coded 2D display image generating method; a joining method decoder 2502 is a portion that decodes the coded data of joining method information to obtain the joining method used at coding; a decoder 2503 is a portion that decodes the coded joined image; a 2D display image generating method decoder 2505 is a portion that decodes the coded 2D display image generating method; and a 2D display image generator 2504 is a portion that generates a 2D display image to be output on the display portion based on the decoded joined image, the decoded joining method and the decoded 2D display image generating method. Joining method decoder 2502 and decoder 2503 provide the same functions as in FIG. 4. Further, 2D display image generating method decoder 2505 provides the same function as in FIG. 20, so that description is omitted herein.

Demultiplexer 2501 separates the coded data into the coded 2D display image generating method, the coded joining method and the coded joined image. These pieces of data are decoded by 2D display image generating method decoder 2505, joining method decoder 2502 and decoder 2503, respectively. Based on these pieces of information, 2D display image generator 2504 constructs the 2D display image.

Figure 24:
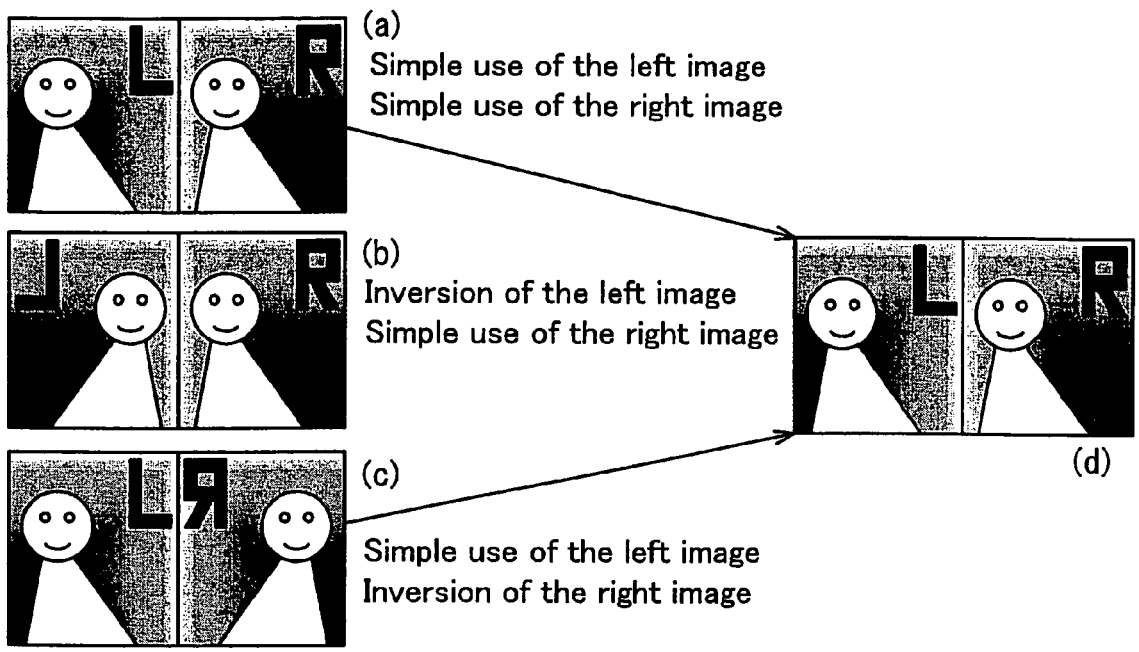
FIG. 24 is an illustrative view showing an example of a process for deciding 2D display image generating method from the joined image in the present invention.

In this way, use of the image coding apparatus and image decoding apparatus shown in FIGS. 24 and 25 makes it possible to provide the definite 2D display image which does not depend on the image decoding apparatus, in the same manner as in FIGS. 18 and 20.

Description up to here has been made referring to the cases of two-view stereo images. However, the present invention can be also applied to stereo multi-view images viewed from three or more viewpoints.

The Sixth Embodiment

Next, the sixth embodiment of the present invention will be described. This embodiment provides a recording media or a transmission media for storing the coded data obtained by multiplexing of the joined image, joining method, 2D display image generating method and the like described in the foregoing embodiments.

Figure 26:
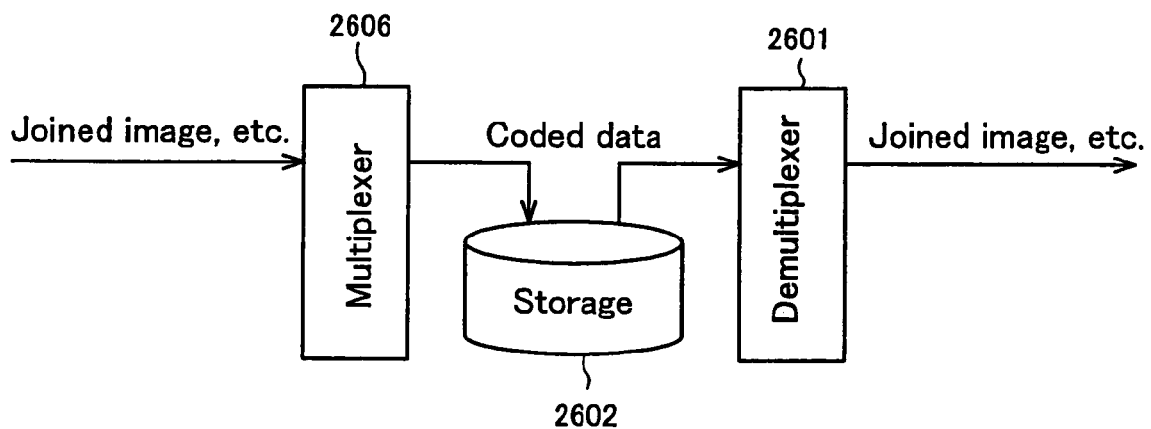
FIG. 26 is a block diagram showing a recording medium of the sixth embodiment of the present invention.

FIG. 26 is a block diagram showing a recording medium in the sixth embodiment. A multiplexer 2606 is a portion that multiplexes the input joined image, joining method, 2D display image generating method and the like in the predetermined format to output coded data; a recording portion 2602 is a portion that records the coded data; a demultiplexer 2601 is a portion that demultiplexes input coded data and separates it into the joined image, joining method, 2D display image generating method and the like.

Figure 27:
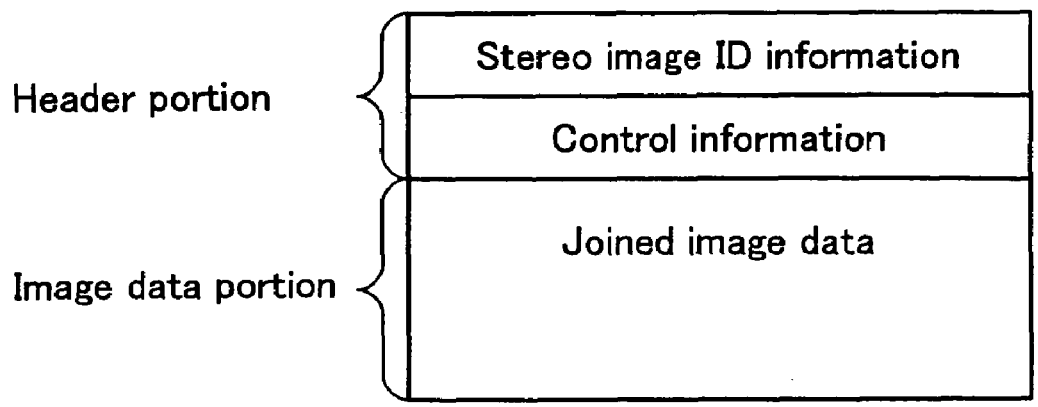
FIG. 27 is an illustrative view showing a storage format into the recording medium of the sixth embodiment of the present invention.

FIG. 27 is an example of a format for storing coded stereo image data on the recording medium. This format, in addition to the coded data of a joined image, at least contains stereo image identification information that indicates that the data is of a stereo image made up of a plurality of images and various pieces of control information as the header.

As the control information, the information on the joining method (joining direction, image inversion identification information, shift quantity) and 2D display image generating method and the like can be considered. These pieces of control information are coded by variable length coding or fixed length coding, and then multiplexed together with the coded data of the joined image by the multiplexer. At decoding, the multiplexed data is demultiplexed by the demultiplexer, then the coded data of the control information is decoded so that the decoded data can be used by the display data generator in FIG. 4, FIG. 9 or FIG. 14, or by the 2D display image generator in FIG. 20 or FIG. 25.

The case shown in FIG. 27 has only one header portion at the lead of the joined image data. However, when the joined image data is composed of a plurality of joined images as in the data of a movie, one header portion may be added for the lead of each piece of joined image data. Alternatively, the header portion may be stored repeatedly at arbitrary positions within the coded data.

Figure 28:
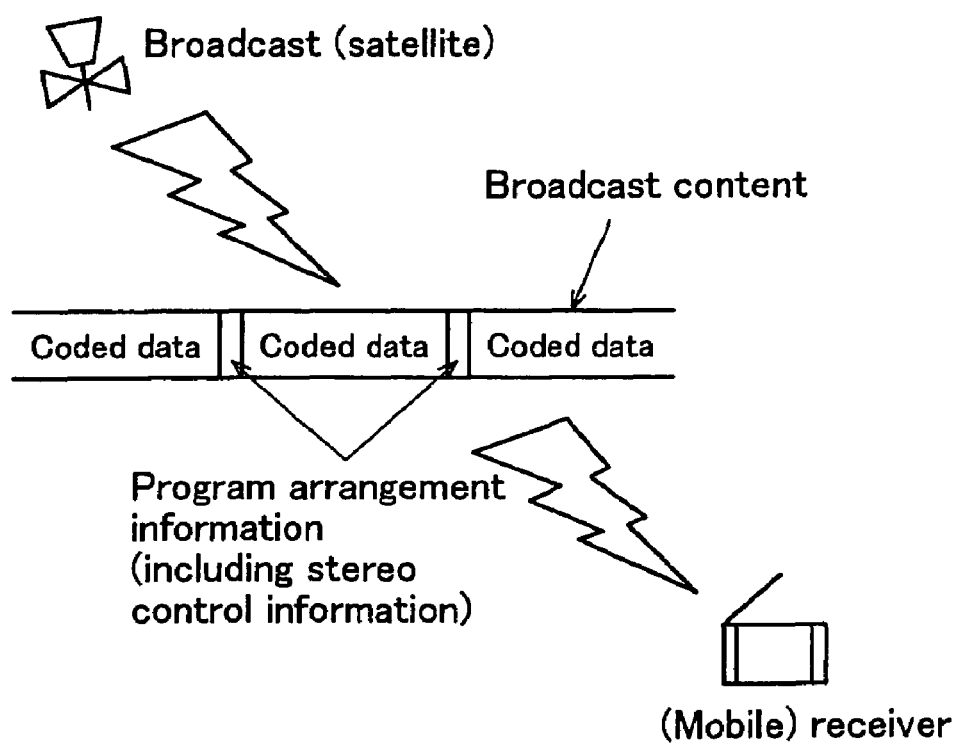
FIG. 28 is an illustrative view showing a storage format into transmission media of the sixth embodiment of the present invention.
Figures 29, 30:
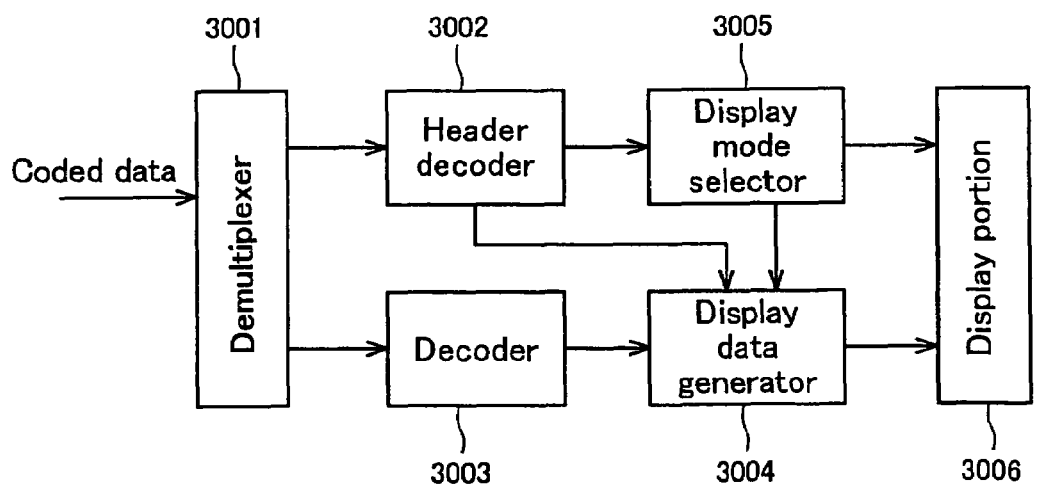
FIG. 29 is an illustrative view showing a stereo control information syntax example of service information.
FIG. 30 is a block diagram showing an image decoding apparatus in the seventh embodiment of the present invention.

In the case where a movie is broadcast via transmission media such as satellites, ground waves, internet and the like, the viewers may start receiving or watching the broadcast from halfway or may change the channel. Therefore, as illustrated in FIG. 28, instead of providing the stereo image identification information and control information at a single header portion at the lead, it is preferred that these pieces of information is inserted periodically as the program arrangement information within the broadcast content. Here, the broadcast content is coded data in which stereo image data, audio data, BML data relating to these contents and the like are multiplexed. The program arrangement information contains information which indicates correlation of data such as image data, audio data, BML data and the like (synchronization information), copyright information and the like. The joining method of the present invention and the stereo control information including 2D display image generating method are also stored herein. FIG. 29 shows a syntax example of stereo control information in the program arrangement information. The syntax contains a stereo control information identifier field that contains an identifier indicating the entity of stereo control information and a stereo control information length field that indicates the information length of this entire information, further including, as required, the information of the joining method and 2D display image generating method. It should be noted that, instead of being included in the program arrangement information, the stereo control information may be directly and repeatedly multiplexed into the coded data.

As has been described, according to the present embodiment, the stereo image identification information and control information are coded and recorded or transmitted together with the joined image of a stereo image, whereby it is possible to perform suitable image display on the decoder side.

The Seventh Embodiment

Next, the seventh embodiment of the present invention will be described. This embodiment provides an image decoding apparatus which makes display by automatically selecting the display mode when the display portion of effecting actual display of the display data or 2D display image (both referred to as display data, hereinbelow) generated by the display data generator or 2D display image generator in the embodiments up to now is compatible with both stereo display and 2D display.

FIG. 30 is a block diagram showing an image decoding apparatus in the seventh embodiment.

A demultiplexer 3001 is a portion that demultiplexes coded data to extract coded image data and a coded header; a header decoder 3002 is a portion that decodes the coded header; a decoder 3003 is a portion that decodes the coded image data; a display mode selector 3005 is a portion that makes choice of whether the image data decoded based on the information contained in the header is displayed stereoscopically or two-dimensionally; a display data generator 3004 is a portion that generates display data to be output on the display portion, based on the decoded header information and the decoded image data; and a display portion 3006 is a portion that displays the display data in accordance with the designated display mode. Decoder 3003 provides the same function as that of FIG. 4, so that description is omitted herein.

Demultiplexer 3001 demultiplexes coded data to extract coded image data and a coded header. Here, the image data is either 2D image data or joined image data made up of a plurality of images viewed from a plurality of viewpoints. The header is pieces of information including stereo image identification information, control information and the like.

Header decoder 3002 decodes the coded header to extract stereo image identification information, control information and the like. When the image data is a 2D image, no stereo image identification information is contained, so that it is possible to judge whether the image data is for a 2D image or for a joined image for stereoscopic representation, from the presence of the aforementioned information.

Display mode selector 3005 judges whether display portion 3006 should operate in the stereo display mode or in the 2D display mode from the header information and sets it up for display portion 3006. One of the possible methods of selecting the display mode from the header information is that, if, for example, the header contains stereo image identification information, display portion 3006 is set into the stereo display mode while it is set into the 2D display mode if none of the information is included.

Display data generator 3004 generates display data to be displayed on display portion 3006, based on the decoded header information, the decoded image data and the display mode selected by the display mode selector 3005.

Display portion 3006 has two display modes, i.e., 2-dimensional display mode and stereo display mode, and outputs the display data in accordance with the selected display mode.

As has been described heretofore, use of the image decoding apparatus of this embodiment makes it possible to automatically switch the display between stereo representation and 2D representation, in accordance with the content of the coded data.

In the foregoing description, the cases where input images of data are sub-sampled with respect to the horizontal direction and then joined were described. The present invention can also be applied to cases where input images of data are unsub-sampled and joined, cases where input images of data are sub-sampled with respect to the vertical direction and then joined, and cases where input images of data are sub-sampled with respect to the horizontal and vertical directions and then joined, and other cases.

For example, in a case where a stereo display device uses a mechanism of switching display every field between the image for the right eye and the image for the left eye in an alternating manner, the input images are sub-sampled with respect to the vertical direction and joined. Further, when a stereo display device should deal with both the mechanism of switching left and right every field and the mechanism of arranging left and right every vertical strip as with a lenticular or parallax barrier, the input images are unsub-sampled and joined. Moreover, if the resolution of the joined image is set at a desired value, it can be done by sub-sampling the input images with respect to the horizontal and vertical directions in accordance with the resolution of the input images.

The Eighth Embodiment

Next, an image recording apparatus of the eighth embodiment of the present invention will be described. This embodiment is a recording apparatus for recording stereo movies on digital videotape.

Figure 31:
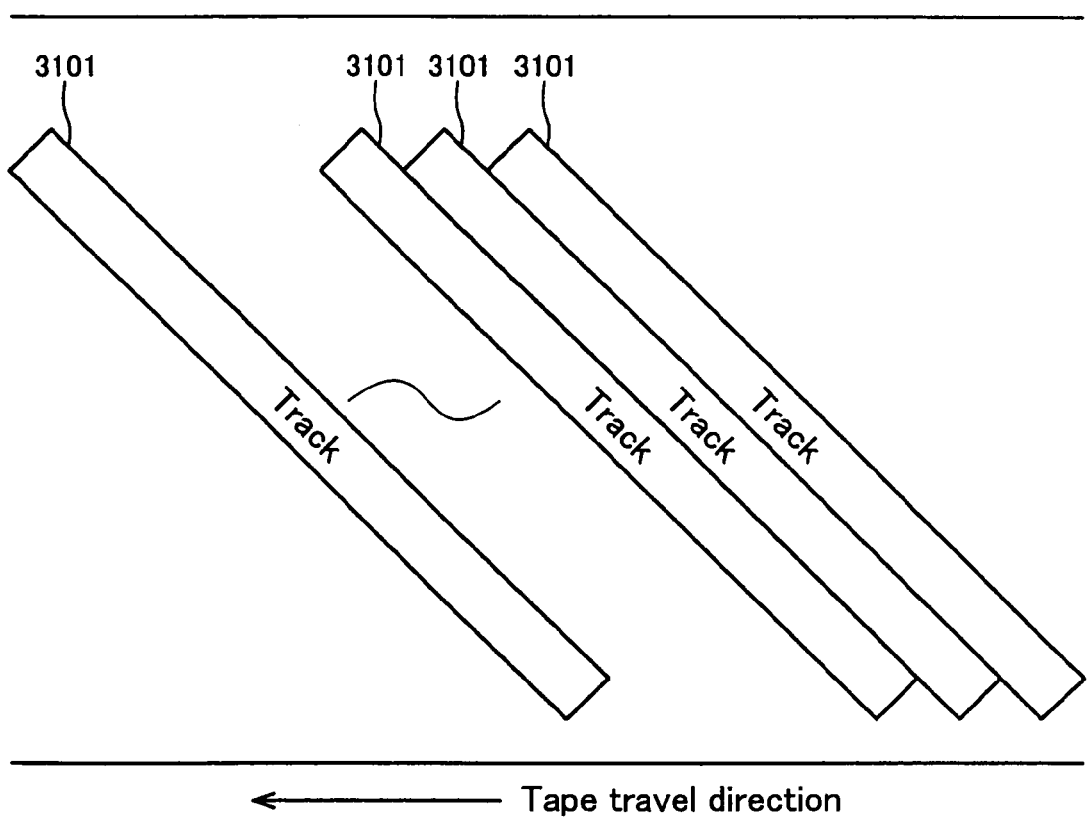
FIG. 31 is an illustrative view showing a digital video tape format recorded by an image recording apparatus of the eighth embodiment of the present invention.

To begin with, the track format of the digital videotape recorded by the present embodiment will be described. In generally and widely used digital VTRs, a system called helical scan is adopted. In this system, data is recorded onto discontinuous tracks on the tape. This situation is shown in FIG. 31, wherein a number of tracks 3101 exist on the tape and one frame of stereo image is dividedly recorded into a plurality of tracks 3101.

Figure 32:
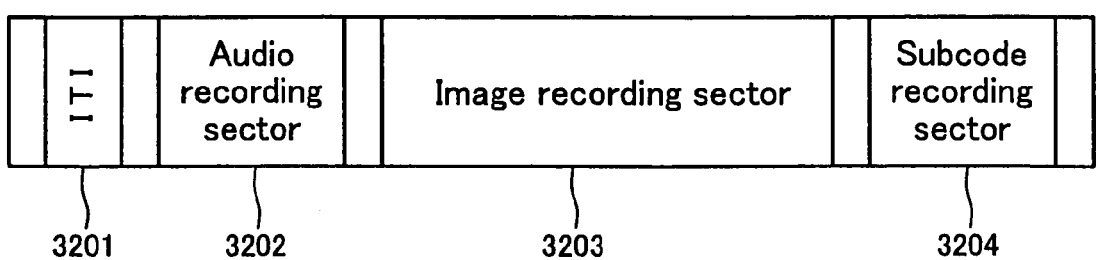
FIG. 32 is another illustrative view showing a digital video tape format recorded by an image recording apparatus of the eighth embodiment of the present invention.

FIG. 32 shows the enlargement of one of tracks 3101 and shows one example of the digital VTR track format recorded by the present embodiment. Track 3101 is composed of an ITI (Insert and Track Information) sector 3201 for securing post-recording, an audio recording sector 3202 for recording data for sounds, an image recording sector 3203 for recording data for images and a subcode recording sector 3204 for recording associated information such as a time code. In the image recording sector 3203, other than stereo images, associated information relating to the stereo images can also be recorded. Similarly, in audio recording sector 3202, other than sounds, associated information relating to the sounds can also be recorded. Other than these, associated information can be recorded also in the aforementioned subcode recording sector 3204. There are margins between the sectors so as to permit separate post-recording.

Figure 33:
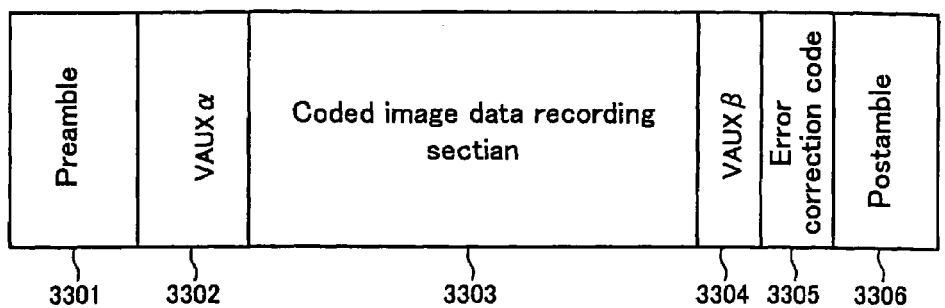
FIG. 33 is still another illustrative view showing a digital video tape format recorded by an image recording apparatus of the eighth embodiment of the present invention.

FIG. 33 shows the enlargement of image recording sector 3203. Image recording sector 3203 is composed of a preamble 3301 having a synchronization pattern and the like recorded therein, VAUX (video auxiliary data)$\alpha$ 3302 and VAUX$\beta$ 3304 for recording associated information as to images, a coded image data recording section 3303 where coded image data is recorded, an error correction code 3305 and a postamble 3306 having the function of affording a margin. In the present embodiment, two separate areas VAUX$\alpha$ 3302 and VAUX$\beta$ 3304 are provided to record associated information as to images, but these in sum will be hereinbelow called a VAUX section.

Further, though not illustrated, audio recording sector 3202 also has an AAUX (audio auxiliary data) section for recording associated information as to sound.

Figure 34:
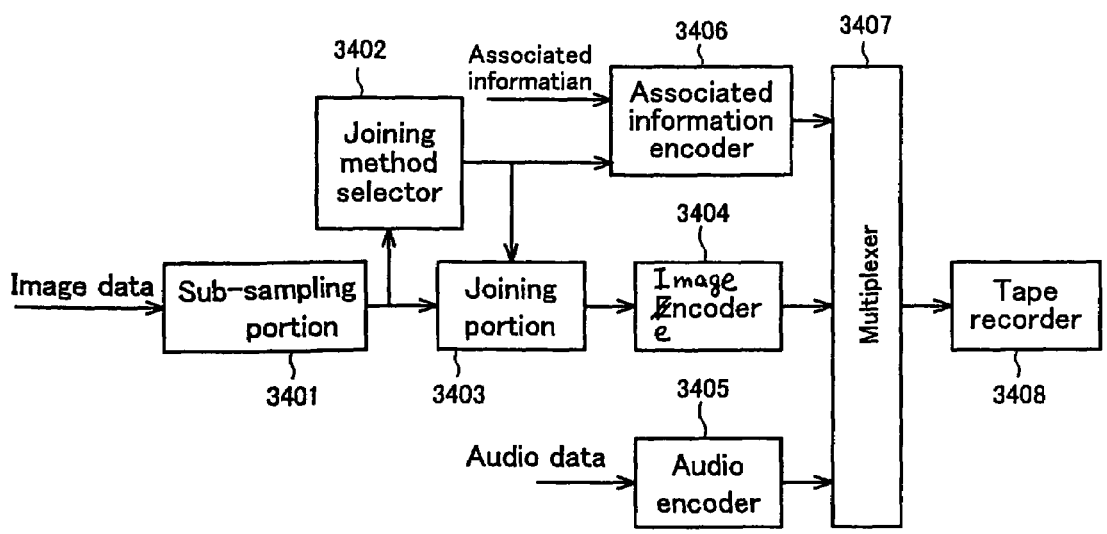
FIG. 34 is a block diagram showing an image recording apparatus configuration of the eighth embodiment of the present invention.

Referring next to FIG. 34, the recording apparatus of the present embodiment will be described. FIG. 34 is a block diagram showing a configuration of a recording apparatus of this embodiment. As shown in FIG. 34, this recording apparatus includes a sub-sampling portion 3401, a joining method selector 3402, a joining portion 3403, an image encoder 3404, an audio encoder 3405, an associated information encoder 3406, a multiplexer 3407 and a tape recorder 3408.

Since sub-sampling portion 3401, joining method selector 3402, joining portion 3403 and image encoder 3404 operate in the same manner as the sub-sampling portion 101, joining method selector 104, joining portion 102 and encoder 103 in FIG. 1 showing the image coding apparatus of the first embodiment of the present invention, description is omitted here.

Audio encoder 3405 receives audio data and encodes it to output encoded audio data.

Associated information encoder 3406 encodes associated information such as the information of the joining method used for joining the left and right images in stereo image encoder 3404, 2D display generating method and the like and outputs coded associated information data. The encoding herein can be done by conversion of each piece of information into a bit string having a fixed length corresponding to the information or other methods.

Multiplexer 3407 receives coded stereo image data, information of the joining method selected at joining, coded audio data and coded associated information data, multiplexes these in the format that permits recording on the tape and outputs data for tape recording.

Tape recorder 3408 records the data for tape recording onto the recording medium, i.e., tape, in accordance with the format mentioned above.

Figure 35:
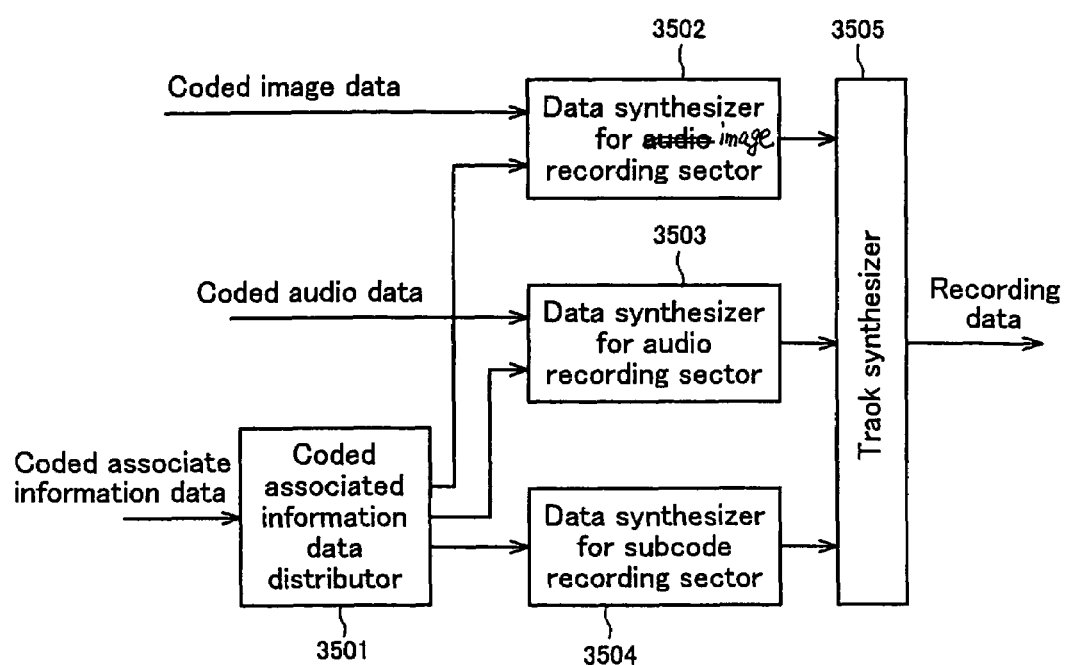
FIG. 35 is another block diagram showing an image recording apparatus configuration of the eighth embodiment of the present invention.

Referring next to FIG. 35, multiplexer 3407 will be described in detail. As shown in FIG. 35, multiplexer 3407 includes a coded associated in formation data distributor 3501, an image recording sector data synthesizer 3502, an audio recording sector data synthesizer 3503, a subcode recording sector data synthesizer 3504 and a track synthesizer 3505.

Coded associated information data distributor 3501 receives coded associated information data and determines where each piece of information should be recorded among the VAUX section, AAUX section, subcode sector and distributes them. In this embodiment, the coded data of the joining method of the left and right images is allotted to the VAUX section and the coded data of the 2D display generating method is allotted to the subcode sector.

Image recording sector data synthesizer 3502, receives the coded stereo image data output from stereo image encoder 3404 and the coded data of associated information for the VAUX section output from coded associated information data distributor 3501 and joins the coded associated information data and the coded stereo image data into the format shown in FIG. 33. The synthesizer further adds preamble 3301, error correction code 3305 and postamble 3306 to the above data to output the data for the image recording sector.

Audio recording sector data synthesizer 3503 receives the coded audio data output from audio encoder 3405 and the coded data of the associated information for the AAUX section output from coded associated information data distributor 3501, and joins these into the predetermined format to output the data for the audio recording section.

Subcode recording sector data synthesizer 3504 receives the coded data of the associated information for subcode sector output from coded associated information data distributor 3501 and joins these into the predetermined format to output the data for the subcode recording sector.

Track synthesizer 3505 receives data for image recording sector, data for audio recording sector and data for subcode recording sector and joins them into the format shown in FIG. 32 and further adds ITI information 3201 and margins between sectors to output the recording data.

Here in the present embodiment, the audio recording sector, image recording sector and subcode recording sector are recording at the same time, but these are not necessarily recorded simultaneously. Part of them, for example, the audio recording sector and image recording sector alone are recorded first and the subcode recording sector can be recorded by post-recording. Alternatively, if all the areas are recorded at the same time, it is possible to overwrite each sector, individually by post-recording.

The joining method of the left and right images is decided first at shooting and there is low possibility that the mode is changed at the editing stage that follows. In the present embodiment, since the joining method of the left and right images is recorded in the VAUX section in the image recording sector, there is no fear of the joining method being changed accidentally even when the audio recording sector and subcode sector are rewritten by post-recording.

On the other hand, the information of the 2D display generating method is not always decided at shooting, but there is a possibility that it is decided at the editing stage after shooting, depending on the finishing of the final content. For example, there is a case where the 2D display generating method information has been recorded with default setting at shooting and is overwritten at post-recording by checking the finish in the editing stage. In the recording apparatus of the present embodiment, the information of the 2D display generating method is recorded in the subcode sector which permits easy rewriting at post-recording. Therefore, it is possible to modify it easily at the editing stage.

Further, in the present embodiment, the information of the 2D display generating method is recorded in the subcode sector, but there is another way in that this information is recorded in the VAUX section, together with the joining method of the left and right images, by regarding this information as the associated information relating to the image. To deal with this, the operation of coded associated information data distributor 3501 in FIG. 35 is modified so that the coded data of all the above information is output to the VAUX section. In this case, though easiness of post-recording cannot be obtained, all pieces of the associated information relating to the image are gathered in one place, bringing an advantage of easy handling. For example, when a duplicate is made on a medium having another recording format, making a copy of the image recording sector only enables acquisition of all the information relating to the image, hence there is no need to handle the subcode sector. Further, in order to avoid loss of information due to overwriting at post-recording, it is also possible to record the subject information in both the subcode sector and the VAUX section.

Alternatively, since the storage sizes of the subcode sector and VAUX sections are limited, if the information as to stereo images cannot be stored in these areas, it is possible to adapt the information to be stored into the AAUX section.

Further, some digital VTRs are provided with a cassette memory for recording associated information. In this case, it is possible to provide a configuration in which the associated information is adapted to be recorded into the cassette memory.

The configuration of the present embodiment is able to conform to the so-called digital VTR system which is popular for home use in all except the special part unique to stereo images. Therefore, if, of the associated information recorded by the present embodiment, the associated information unique to stereo images, for example, the information as to the joining method of the left and right images, the information as to stereo intensity, the threshold information and the like are recorded into the extension area which is permitted in the home use digital VTR format, it is possible to record planar images and stereo images on the same tape.

INDUSTRIAL APPLICABILITY

The image coding apparatus, image decoding apparatus, recording medium and image recording apparatus according to the present invention is to code, decode or record the associated information unique to stereo images, for example the information as to the joining method of stereo images, and is suitable for application to digital VTRs and the like, which records and reproduces stereo images.

The invention claimed is:

1. An image coding apparatus for coding a plurality of images data corresponding respectively to a plurality of viewpoints, comprising:
   a joining means for joining the plurality of images data based on a predetermined joining method;
   a coding means for coding a joined image data; and
   a 2-dimensional display image generating method coding means for coding a 2-dimensional display image generating method representing how a 2-dimensional display image is generated from the joined image data,
   wherein the joining method represents an arrangement position of the image data that should be joined and an inversion direction of the image data that should be joined, and
   wherein the 2-dimensional display image generating method represents image data that should be used within the joined image data.

2. An image decoding apparatus for decoding coded data of joined image data, the joined image data being formed by joining a plurality of images data corresponding respectively to a plurality of viewpoints, in a predetermined joining method, comprising:
   a demultiplexing means for extracting, from coded data being input, the coded joined image data and 2-dimensional display image generating information representing how a 2-dimensional display image is generated from the joined image data,
   a decoding means for decoding the coded joined image data;
   a 2-dimensional display image generating method decoding means for decoding the 2-dimensional display image generating information; and
   a 2-dimensional display image generating means for generating a 2-dimensional display image, from the decoded joined image data based on the decoded 2-dimensional display image generating information,
   wherein the 2-dimensional display image generating information represents image data that should be used within the joined image data, and
   wherein the joining method represents an arrangement position of the image data that should be joined and an inversion direction of the image data that should be joined.

3. The image decoding apparatus according to claim 2, wherein the 2-dimensional display image is a miniaturized image for displaying a plurality of the joined images data in a menu representation.

4. The image decoding apparatus according to claim 2, further comprising a display means capable of switching between a stereo representation and a 2-dimensional representation.

5. The image decoding apparatus according to claim 4, wherein automatic switching is done between the stereo representation and the 2-dimensional representation, based on information stored in a header portion.

6. An image recording apparatus for recording a plurality of images data corresponding respectively to a plurality of viewpoints, into a recording area, comprising:
   a joining means for joining the plurality of images data using a predetermined joining method; and
   a 2-dimensional display image generating method coding means for encoding a 2-dimensional display image generating method representing how a 2-dimensional display image data is generated from the joined image data,
   wherein the recording area includes:
   an image recording sector for recording the joined image data or the 2-dimensional image data;
   an audio recording sector for recording an audio data; and
   a subcode sector for recording an associated information and
   wherein the 2-dimensional display image generating method represents image data that should be used within the joined image data, and
   wherein the joining method represents an arrangement position of the image that should be joined and an inversion direction of the image data that should be joined.

7. An image recording apparatus for recording a plurality of images data corresponding respectively to a plurality of viewpoints, into a recording area, comprising:
   a joining means for joining the plurality of images data using a predetermined joining method; and
   a 2-dimensional display image generating method coding means for encoding a 2-dimensional display image generating method representing how a 2-dimensional display image data is generated from the joined image data,
   wherein the recording area includes an image recording sector for recording the joined image data or the 2-dimensional image data, and a coded data of the 2-dimensional display image generating method is recorded in the image recording sector,
   wherein the 2-dimensional display image generating method represents image data that should be used within the joined image data, and
   wherein the joining method represents an arrangement position of the image data that should be joined and an inversion direction of the image data that should be joined.

8. An image recording apparatus for recording a plurality of images data corresponding respectively to a plurality of viewpoints, into a recording area, comprising:
   a joining means for joining the plurality of images data using a predetermined joining method; and
   a 2-dimensional display image generating method coding means for encoding a 2-dimensional display image generating method representing how a 2-dimensional display image data is generated from the joined image data,
   wherein the recording area includes an audio recording sector for recording an audio data, and a coded data of the 2-dimensional display image generating method is recorded in the audio recording sector, wherein the 2-dimensional display image generating method represents image data that should be used within the joined image data,
   wherein the joining method represents an arrangement position of the image data that should be joined and an inversion direction of the image data that should be joined.

9. An image recording apparatus for recording a plurality of images data corresponding respectively to a plurality of viewpoints, into a recording area, comprising:
   a joining means for joining the plurality of images data using a predetermined joining method; and
   a 2-dimensional display image generating method coding means for encoding a 2-dimensional display image generating method representing how a 2-dimensional display image data is generated from the joined image data,
   wherein the recording area includes a subcode sector for recording an associated information, and a coded data of the 2-dimensional display image generating image is recorded in the subcode recording sector,
   wherein the 2-dimensional display image generating method represents image data that should be used within the joined image data, and wherein the joining method represents an arrangement position of the image data that should be joined and an inversion direction of the image data that should be joined.

10. The image decoding apparatus according to claim 3, further comprising a display means capable of switching between a stereo representation and a 2-dimensional representation.

11. The image coding apparatus according to claim 1, wherein the 2-dimensional display image generating method further represents an inversion direction of the image data that should be used.

12. The image decoding apparatus according to claim 2, wherein the 2-dimensional display image generating information further represents an inversion information representing an inversion direction of the image data that should be used.

13. The image recording apparatus according to claim 6, wherein the 2-dimensional display image generating method further represents an inversion direction of the image data that should be used.

14. The image recording apparatus according to claim 7, wherein the 2-dimensional display image generating method further represents an inversion direction of the image data that should be used.

15. The image recording apparatus according to claim 8, wherein the 2-dimensional display image generating method further represents an inversion direction of the image data that should be used.

16. The image recording apparatus according to claim 9, wherein the 2-dimensional display image generating method further represents an inversion direction of the image data that should be used.

* * * * *